(12) United States Patent
Konishi et al.

(10) Patent No.: US 11,139,458 B2
(45) Date of Patent: Oct. 5, 2021

(54) ORGANIC ELECTROLUMINESCENT DISPLAY DEVICE

(71) Applicant: FUJIFILM Corporation, Tokyo (JP)

(72) Inventors: Toshihiro Konishi, Kanagawa (JP); Kenta Yamazaki, Kanagawa (JP); Shinpei Yoshida, Kanagawa (JP); Ryo Satake, Kanagawa (JP); Hiroyuki Okusa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 13 days.

(21) Appl. No.: 16/750,624

(22) Filed: Jan. 23, 2020

(65) Prior Publication Data

US 2020/0161589 A1    May 21, 2020

Related U.S. Application Data

(63) Continuation of application No. PCT/JP2018/027959, filed on Jul. 25, 2018.

(30) Foreign Application Priority Data

Jul. 26, 2017 (JP) .............................. JP2017-144627
Dec. 8, 2017 (JP) .............................. JP2017-236389

(51) Int. Cl.
*H01L 51/52* (2006.01)
*H01L 27/32* (2006.01)
(Continued)

(52) U.S. Cl.
CPC ............ *H01L 51/5281* (2013.01); *G02B 5/30* (2013.01); *H01L 27/32* (2013.01);
(Continued)

(58) Field of Classification Search
CPC .............................. H01L 51/5281; G02B 5/30
See application file for complete search history.

(56) References Cited

U.S. PATENT DOCUMENTS

2015/0369981 A1  12/2015  Takeda et al.
2017/0200915 A1   7/2017  Lee et al.
(Continued)

FOREIGN PATENT DOCUMENTS

JP    2014-170221 A    9/2014
JP    2017-102443 A    6/2017
(Continued)

OTHER PUBLICATIONS

International Search Report issued in PCT/JP2018/027959 dated Oct. 23, 2018.
(Continued)

*Primary Examiner* — Farun Lu
(74) *Attorney, Agent, or Firm* — Jean C. Edwards, Esq.; Edwards Neils LLC

(57) ABSTRACT

An organic EL display device is provided in which a change in tint is reduced in a bent portion. This organic EL display device is an organic electroluminescent display device including, from a viewing side, a circularly polarizing plate, a first adhesion layer, and a bendable organic electroluminescent display panel, in which the circularly polarizing plate includes, from the viewing side, a linear polarizer, a second adhesion layer, and a phase difference layer functioning as a λ/4 plate, a complex modulus of elasticity of the first adhesion layer is $2.50 \times 10^5$ Pa or less, the first adhesion layer is thicker than the second adhesion layer, and an absorption axis of the linear polarizer is positioned at an angle of 0°±30° or 90°±30° with respect to an extension direction of a ridge line formed in a case where the organic electroluminescent display device is bent.

14 Claims, 2 Drawing Sheets

(51) Int. Cl.
  *H01L 51/00* (2006.01)
  *G02B 5/30* (2006.01)
(52) U.S. Cl.
  CPC ...... *H01L 27/3244* (2013.01); *H01L 51/0097* (2013.01); *H01L 2251/5338* (2013.01); *H01L 2251/558* (2013.01)

(56) References Cited

U.S. PATENT DOCUMENTS

| | | | |
|---|---|---|---|
| 2017/0309867 A1* | 10/2017 | Mun | ............... H01L 51/5253 |
| 2018/0006275 A1 | 1/2018 | Maruyama et al. | |
| 2018/0149785 A1* | 5/2018 | Lee | ............... G02F 1/133305 |
| 2018/0329125 A1 | 11/2018 | Hikita et al. | |

FOREIGN PATENT DOCUMENTS

| | | |
|---|---|---|
| JP | 2017-126061 A | 7/2017 |
| WO | 2016/158300 A1 | 10/2016 |

OTHER PUBLICATIONS

Written Opinion issued in PCT/JP2018/027959 dated Oct. 23, 2018.
International Preliminary Report on Patentability completed by WIPO on Jan. 28, 2020 in connection with International Patent Application No. PCT/JP2018/027959.

* cited by examiner

ORGANIC ELECTROLUMINESCENT DISPLAY DEVICE

CROSS-REFERENCE TO RELATED APPLICATIONS

This application is a Continuation of PCT International Application No. PCT/JP2018/027959 filed on Jul. 25, 2018, which was published under PCT Article 21(2) in Japanese, and which claims priority under 35 U.S.C. § 119(a) to Japanese Patent Application No. 2017-144627 filed on Jul. 26, 2017 and Japanese Patent Application No. 2017-236389 filed on Dec. 8, 2017. The above applications are hereby expressly incorporated by reference, in their entirety, into the present application.

BACKGROUND OF THE INVENTION

1. Field of the Invention

The present invention relates to an organic electroluminescent display device.

2. Description of the Related Art

Conventionally, in order to suppress adverse effects of reflection of external light, a circularly polarizing plate has been used in an organic electroluminescent (EL) display device (hereinafter, also referred to as "organic EL display device").

On the other hand, in recent years, there has been an increasing demand for making an organic EL display device flexible (bendable).

However, in a case where an organic EL display device is bent with a very small curvature diameter, a large force is applied to a phase difference film (a tensile force is applied to a part thereof and a compressive force is applied to another part) in a circularly polarizing plate, and the optical properties of the portion are changed. In JP2014-170221 A, in order to solve the above problem, a circularly polarizing plate including a phase difference film exhibiting predetermined optical properties, in which the slow axis direction of the phase difference film is adjusted to define an angle of 20 to 70 degrees with respect to a bending direction of a display device, is provided.

SUMMARY OF THE INVENTION

On the other hand, in recent years, there has been a demand for further improvement in the visibility of an organic EL display device, and there has been a demand for further reduction in a change in tint in a bent portion in a case where a bendable organic EL display device is bent.

The present inventors have examined the characteristics of the circularly polarizing plate disclosed in JP2014-170221A and have found that the above demands cannot always be satisfied and further improvement is required.

Here, an object of the present invention is to provide an organic EL display device in which a change in tint is reduced in a bent portion.

As a result of intensive investigations on problems in the related art, the present inventors have found that the above problems can be solved by adopting the following configurations.

(1) An organic electroluminescent display device comprising: from a viewing side, a circularly polarizing plate; a first adhesion layer; and a bendable organic electroluminescent display panel,
in which the circularly polarizing plate includes, from the viewing side, a linear polarizer, a second adhesion layer, and a phase difference layer functioning as a λ/4 plate,
a complex modulus of elasticity of the first adhesion layer is $2.50 \times 10^5$ Pa or less,
the first adhesion layer is thicker than the second adhesion layer, and
an absorption axis of the linear polarizer is positioned at an angle of 0°±30° or 90°±30° with respect to an extension direction of a ridge line formed in a case where the organic electroluminescent display device is bent.

(2) The organic electroluminescent display device according to (1), in which the phase difference layer exhibits reverse wavelength dispersibility.

(3) The organic electroluminescent display device according to (1) or (2), in which the phase difference layer includes a λ/2 plate exhibiting forward wavelength dispersibility and a λ/4 plate exhibiting forward wavelength dispersibility.

(4) The organic electroluminescent display device according to (3), in which at least one of the λ/2 plate or the λ/4 plate is a layer formed by using a liquid crystal compound.

(5) The organic electroluminescent display device according to (1) or (2), in which the phase difference layer includes a single layer of λ/4 plate exhibiting reverse wavelength dispersibility.

(6) The organic electroluminescent display device according to (5), in which the λ/4 plate is a layer formed by using a liquid crystal compound.

(7) The organic electroluminescent display device according to any one of (1) to (6), in which the phase difference layer further includes a positive C-plate in which a retardation in a thickness direction is −150 to −10 nm at a wavelength of 550 nm.

(8) The organic electroluminescent display device according to any one of (1) to (7), in which the phase difference layer has a thickness of 20 µm or less.

According to the present invention, it is possible to provide an organic EL display device in which a change in tint is reduced in a bent portion.

DESCRIPTION OF THE PREFERRED EMBODIMENTS

Figure 1:
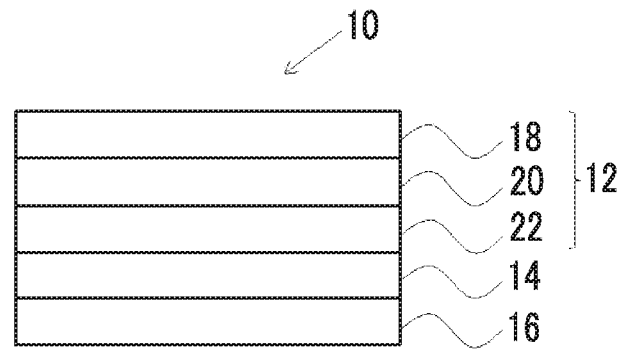
FIG. 1 is a cross-sectional view showing an embodiment of an organic EL display device according to the present invention.

Hereinafter, the present invention will be described in detail. The descriptions of the constituent elements described below are based on representative embodiments of the present invention, but the present invention is not limited to such embodiments.

In the present specification, the numerical value range expressed by the term "to" means that the numerical values described before and after "to" are included as a lower limit and an upper limit, respectively.

In addition, the terms "orthogonal" and "parallel" with respect to angles means a range of a precise angle±10°, and the terms "same" and "different" with respect to angles can be determined based on whether the difference is less than 5°.

In the present specification, the term "visible light" refers to light in a wavelength range of 380 to 780 nm. Unless otherwise specified, the measurement wavelength is 550 nm in the present specification.

In the present specification, the term "slow axis" means a direction in which a refractive index is maximized in a plane.

In the present specification, the term "tilt angle" means an angle formed between a tilted liquid crystal compound and the plane of layer and means the largest angle out of angles formed between the direction of maximum refractive index and the plane of layer in a refractive index ellipsoid of the liquid crystal compound. Accordingly, as for a rod-like liquid crystal compound having a positive optical anisotropy, the tilt angle means an angle formed between the longitudinal direction of the rod-like liquid crystal compound, that is, the director direction, and the plane of layer. In the present invention, the "average tilt angle" means an average value of the tilt angles at the upper interface and the lower interface of the phase difference layer.

In the present invention, $Re(\lambda)$ and $Rth(\lambda)$ respectively represent an in-plane retardation and a retardation in a thickness direction at a wavelength $\lambda$. For example, $Re(450)$ represents an in-plane retardation at a wavelength of 450 nm. Unless otherwise specified, the wavelength $\lambda$ is 550 nm.

In the present invention, $Re(\lambda)$ and $Rth(\lambda)$ are values measured at wavelength $\lambda$ in AxoScan OPMF-1 (manufactured by Opto Science, Inc.). By inputting the average refractive index $((Nx+Ny+Nz)/3)$ and the film thickness $(d(\mu m))$ to AxoScan, the following expressions can be calculated.

Slow axis direction (°)

$Re(\lambda)=R0(\lambda)$ $Rth(\lambda)=((nx+ny)/2-nz)\times d$ $R0(\lambda)$ is expressed as a numerical value calculated by AxoScan OPMF-1 but means $Re(\lambda)$.

In the present specification, the refractive indices nx, ny, and nz are measured using an Abbe refractometer (NAR-4T, manufactured by Atago Co., Ltd.), and a sodium lamp ($\lambda$=589 nm) is used as a light source. In addition, in the case where the wavelength dependence is measured, the wavelength dependence can be measured using a combination of a multi-wavelength Abbe refractometer DR-M2 (manufactured by Atago Co., Ltd.) and an interference filter.

In addition, as the refractive index, values described in "Polymer Handbook" (John Wiley & Sons, Inc.) and catalogs of various optical films can also be used. The values of average refractive index of major optical films are as follows: cellulose acylate (1.48), cycloolefin polymer (1.52), polycarbonate (1.59), polymethyl methacrylate (1.49), and polystyrene (1.59).

In the present specification, the Nz factor is a value obtained from $Nz=(nx-nz)/(nx-ny)$.

In the present specification, the definition of C-plate is as follows.

There are two kinds of C-plates: a positive C-plate and a negative C-plate. The positive C-plate satisfies the relationship of Expression (C1), and the negative C-plate satisfies the relationship of Expression (C2). Rth of the positive C-plate shows a negative value and Rth of the negative C-plate shows a positive value.

$nz>nx\cong ny$            Expression (C1)

$nz<nx\cong ny$            Expression (C2)

The expression "$\cong$" includes not only a case in which both are completely the same but also a case in which both are substantially the same. Regarding the expression "substantially the same", for example, "$nx\cong ny$" includes a case in which $(nx-ny)\times d$ (wherein d represents a film thickness) is 0 to 10 nm, and preferably 0 to 5 nm.

The features of the present invention are that the complex modulus of elasticity of a first adhesion layer is adjusted to be a predetermined range, the thickness of the first adhesion layer and the thickness of a second adhesion layer are adjusted to have a predetermined relationship, and a circularly polarizing plate is arranged such that the absorption axis of a linear polarizer is in a predetermined range with respect to the extension direction of a ridge line formed in a case where an organic EL display device is bent. By satisfying the above features, it is considered that even in a case where a tensile force or compressive force is applied to the bent portion in the case where the organic EL display device is bent, particularly, the position of the absorption axis of the linear polarizer is not easily shifted and as a result, the desired effect can be obtained.

Hereinafter, an embodiment of an organic EL display device according to the present invention will be described with reference to the drawings. FIG. 1 shows a cross-sectional view showing an embodiment of a circularly polarizing plate according to the present invention. The drawing in the present invention is a schematic view and the relationships of the thickness and the positional relationship of each layer, and the like do not necessarily match the actual one. The same applies to the following drawings.

An organic EL display device 10 includes, from a viewing side, a circularly polarizing plate 12, a first adhesion layer 14, and an organic EL display panel 16, and the circularly polarizing plate 12 includes, from the viewing side, a linear polarizer 18, a second adhesion layer 20, and a phase difference layer 22 functioning as a $\lambda/4$ plate.

In the following, first, each member included in the organic EL display device will be described in detail.

<Linear Polarizer>

The linear polarizer may be a member having a function of converting light into specific linearly polarized light, and an absorptive type linear polarizer can be mainly used.

As the absorptive type linear polarizer, an iodine-based polarizer, a dye-based polarizer using a dichroic dye, a polyene-based polarizer, and the like may be used. The iodine-based polarizer and the dye-based polarizer include a coating type polarizer and a stretching type polarizer, and any of these polarizers can be applied. Of these polarizers, a polarizer, which is prepared by allowing polyvinyl alcohol to adsorb iodine or a dichroic dye, and performing stretching, is preferable.

In addition, examples of a method of obtaining a linear polarizer by performing stretching and dyeing in a state of a laminated film in which a polyvinyl alcohol layer is formed on a base material include methods disclosed in JP5048120B, JP5143918B, JP5048120B, JP4691205B, JP4751481B, and JP4751486B.

Among these, from the viewpoint of handleability, a linear polarizer containing a polyvinyl alcohol-based resin (a polymer including —CH$_2$—CHOH— as a repeating unit, in particular, at least one selected from the group consisting of polyvinyl alcohol and an ethylene-vinyl alcohol copolymer is preferable) is preferable.

The thickness of the linear polarizer is not particularly limited but from the viewpoint of achieving excellent handleability and excellent optical properties, the thickness is preferably 35 μm or less and more preferably 1 to 25 μm. With the thickness, it is possible to reduce the thickness of the organic EL display device.

<Second Adhesion layer>

The second adhesion layer is a layer for intimately attaching the above-described linear polarizer and the phase difference layer described later.

The thickness of the second adhesion layer is not particularly limited as long as thickness of the second adhesion layer has a predetermined relationship with the thickness of the first adhesion layer described later, but the thickness of the second adhesion layer is preferably 0.5 to 50 μm and more preferably 1 to 10 μm.

The second adhesion layer may be a pressure sensitive adhesive layer or an adhesive layer. The adhesive layer may be a layer obtained by performing curing by light (for example, ultraviolet rays (UV)) irradiation or heating.

Although the method of forming the second adhesion layer is not particularly limited, for example, in a case of using a UV curable type adhesive, a method of applying a UV curable type adhesive to the linear polarizer to form a coating film, laminating the phase difference layer described later on the coating film, then performing UV irradiation and curing the coating film to obtain an adhesive layer may be used. In addition, in a case of using a pressure sensitive adhesive layer, a method of laminating a sheet-like pressure sensitive adhesive layer on the linear polarizer and further laminating the phase difference layer described later on the pressure sensitive adhesive layer may be used.

<Phase Difference Layer>

The phase difference layer is a layer functioning as a λ/4 plate.

The layer functioning as a λ/4 plate is a layer having a function of converting linearly polarized light having a specific wavelength into circularly polarized light (or circularly polarized light into linearly polarized light). More specifically, the phase difference layer is a layer exhibiting an in-plane retardation of Re(λ)=λ/4 (or an odd multiple thereof) at a predetermined wavelength of λ nm. This equation only needs to be achieved at any wavelength in the visible light range (for example, 550 nm), but it is preferable that the in-plane retardation Re(550) at a wavelength of 550 nm satisfies the following relationship.

$$100 \text{ nm} \leq Re(550) \leq 160 \text{ nm}$$

In the above range, it is preferable to satisfy 110 nm≤Re(550)≤150 nm.

The phase difference layer may exhibit forward wavelength dispersibility or reverse wavelength dispersibility, but from the viewpoint of further excellent effects of the present invention, it is preferable to exhibit reverse wavelength dispersibility. It is preferable to exhibit forward wavelength dispersibility and reverse wavelength dispersibility in the visible light range.

The phase difference layer exhibiting forward wavelength dispersibility means that as the measurement wavelength increases, the in-plane retardation decreases.

In addition, the phase difference layer exhibiting reverse wavelength dispersibility means that as the measurement wavelength increases, the in-plane retardation increases.

The thickness of the phase difference layer is not particularly limited and the thickness is 200 μm or less in many cases. From the viewpoint of further excellent effects of the present invention, the thickness is preferably 60 μm or less, more preferably 35 μm or less, and even more preferably 20 μm or less. The lower limit is not particularly limited but is preferably 0.5 μm or more.

The phase difference layer may have a single layer structure or a multilayer structure.

In a case where the phase difference layer has a multilayer structure, it is preferable that the phase difference layer includes a λ/2 plate exhibiting forward wavelength dispersibility and a λ/4 plate exhibiting reverse wavelength dispersibility.

In a case where the phase difference layer includes a λ/2 plate and a λ/4 plate as described above, from the viewpoint that a change in tint is further suppressed and visibility in an oblique direction is further excellent, it is preferable that one of the λ/2 plate and the λ/4 plate is a layer formed by using a rod-like liquid crystal compound and the other is a layer formed by using a disk-like liquid crystal compound.

The λ/2 plate refers to an optically anisotropic layer in which the in-plane retardation Re(λ) satisfies Re(k)=λ/2 at a specific wavelength of λ nm. This equation only needs to be achieved at any wavelength in the visible light range (for example, 550 nm). In the range, it is preferable that the in-plane retardation Re(550) at a wavelength of 550 nm satisfies the following relationship.

$$210 \text{ nm} \leq Re(550) \leq 300 \text{ nm}$$

In the range, it is more preferable to satisfy 220 nm≤Re(550)≤290 nm.

The thickness of the λ/2 plate is not particularly limited but from the viewpoint of thickness reduction, the thickness is preferably 0.5 to 10 μm and more preferably 0.5 to 5 μm.

The above thickness means the average thickness and is obtained by measuring the thickness at random 5 points in the λ/2 plate and arithmetically averaging these values.

The definition of the λ/4 plate is as described above.

An angle θ formed between the slow axis of the λ/4 plate and the slow axis of the λ/2 plate is preferably in a range of 60°±10°, more preferably in a range of 60°±8°, and even more preferably in a range of 60°±5°.

The angle means an angle formed between the slow axis of the λ/4 plate and the slow axis of the λ/2 plate in a case of being viewed from the normal direction of the surface of the linear polarizer.

The thickness of the λ/4 plate is not particularly limited but from the thickness reduction, the thickness is preferably 0.5 to 10 μm and more preferably 0.5 to 5 μm.

The thickness means the average thickness and is obtained by measuring the thickness at random 5 points in the λ/4 plate and arithmetically averaging these values.

In a case where the phase difference layer has a single layer structure, the phase difference layer is preferably constituted of a single layer of λ/4 plate exhibiting reverse wavelength dispersibility.

A preferable range of the thickness of the single layer of λ/4 plate is as described above.

The phase difference layer may further layers other than the above-described λ/2 plate and λ/4 plate, and from the viewpoint of further improving the visibility in the oblique direction, the phase difference layer may further include a positive C-plate in which the retardation in the thickness direction at a wavelength of 550 nm is −150 to −10 nm.

The retardation of the positive C-plate in the thickness direction at a wavelength of 550 nm is preferably −150 to −10 nm and more preferably −120 to −60 nm.

The arrangement position of the positive C-plate in the phase difference layer is not particularly limited and the positive C-plate may be arranged on a side closest to the linear polarizer in the phase difference layer or on a side most opposite to the linear polarizer.

The relationship between the absorption axis of the above-described linear polarizer and the slow axis of the phase difference layer is not particularly limited, but for example, in a case where the phase difference layer includes the λ/2 plate and the λ/4 plate, and the polarizer, the λ/2 plate, and the λ/4 plate are arranged in the circularly polarizing plate from the viewing side, the angle formed between the absorption axis of the linear polarizer and the slow axis of the λ/2 plate is preferably 67° to 83° and more preferably 70° to 80°.

The angle means an angle formed between the absorption axis of the linear polarizer and the slow axis of the λ/2 plate in a case of being viewed from the normal direction of the surface of the linear polarizer.

In addition, in a case where the phase difference layer is constituted of a single layer of λ/4 plate, the angle formed between the absorption axis of the linear polarizer and the slow axis of the λ/4 plate is preferably 37° to 53° and more preferably 40° to 50°.

The angle means an angle formed between the absorption axis of the linear polarizer and the slow axis of the λ/4 plate in a case of being viewed from the normal direction of the surface of the linear polarizer.

The λ/4 plate, the λ/2 plate and the positive C-plate are preferably layers formed by using a liquid crystal compound. However, as long as predetermined characteristics such as the above-mentioned in-plane retardation are satisfied, the plates may be constituted of other materials. For example, the plates may be formed by using a polymer film (particularly, a polymer film subjected to a stretching treatment).

The kind of liquid crystal compound is not particularly limited but, liquid crystal compounds can be classified into a rod-like type (rod-like liquid crystal compound) and a disk-like type (disk-like liquid crystal compound, discotic liquid crystal compound) based on the shape thereof. Further, each kind includes a low molecular type and a high molecular type. A high molecule generally indicates a molecule having a polymerization degree of 100 or more (Masao Doi; Polymer Physics-Phase Transition Dynamics, 1992, IWANAMI SHOTEN, PUBLISHERS, page 2). A mixture of two or more kinds of rod-like liquid crystal compounds, two or more kinds of disk-like liquid crystal compounds, or a rod-like liquid crystal compound and a disk-like liquid crystal compound may be used.

Since changes in temperature and humidity in optical properties can be made small, it is more preferable to form the λ/4 plate, the λ/2 plate and the positive C-plate using a liquid crystal compound (rod-like liquid crystal compound or disk-like liquid crystal compound) having a polymerizable group. The liquid crystal compound may be a mixed compound of two or more kinds. In this case, it is preferable that at least one has two or more polymerizable groups.

That is, it is preferable that the λ/4 plate, the λ/2 plate and positive C-plate are layers formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity any longer.

The kind of the polymerizable group is not particularly limited and a polymerizable group capable of causing radical polymerization or cationic polymerization is preferable.

A known radically polymerizable group can be used as a radically polymerizable group, and an acryloyl group or a methacryloyl group is preferable.

As a cationically polymerizable group, a known cationically polymerizable group can be used, and examples thereof include an alicyclic ether group, a cyclic acetal group, a cyclic lactone group, a cyclic thioether group, a spiro ortho ester group, and a vinyloxy group. Among these, an alicyclic ether group or a vinyloxy group is preferable, and an epoxy group, an oxetanyl group, or a vinyloxy group is more preferable.

The method of forming the λ/4 plate, the λ/2 plate and the positive C-plate is not particularly limited and known methods may be used.

Among these, from the viewpoint of easy control of in-plane retardation, a method of applying a composition (hereinafter, also simply referred to as "composition") including a liquid crystal compound having a polymerizable group (hereinafter, also simply referred to as "polymerizable liquid crystal compound") to form a coating film, subjecting the coating film to an alignment treatment to align the polymerizable liquid crystal compound, and subjecting the obtained coating film to a curing treatment (ultraviolet irradiation (photoirradiation treatment) or heating treatment) to obtain a λ/4 plate, a λ/2 plate and a positive C-plate is preferable.

Hereinafter, the procedures of the method will be described in detail.

First, a composition is applied to a support to form a coating film, and the coating film is subjected to an alignment treatment to align a polymerizable liquid crystal compound.

The composition used includes a polymerizable liquid crystal compound. The definition of the polymerizable liquid crystal compound is as described above.

Although the content of the polymerizable liquid crystal compound in the composition is not particularly limited, the content of the polymerizable liquid crystal compound is preferably 50% by mass or more, more preferably 70% by mass or more, and even more preferably 90% by mass or more with respect to the total solid content of the composition. The upper limit is not particularly limited and is 99% by mass or less in many cases.

The total solid content of the composition does not include a solvent.

The composition may include components other than the above-described polymerizable liquid crystal compound.

In addition, the composition may include a polymerization initiator. A polymerization initiator to be used is selected according to the kind of polymerization reaction and examples thereof include a thermal polymerization initiator and a photopolymerization initiator. Examples of the photopolymerization initiator include an α-carbonyl compound, acyloin ether, an α-hydrocarbon-substituted aromatic acyloin compound, a polynuclear quinone compound, and a combination of triarylimidazole dimer and p-aminophenyl ketone.

The content of the polymerization initiator in the composition is preferably 0.01% to 20% by mass and more preferably 0.5% to 5% by mass with respect to the total solid content of the composition.

In addition, the composition may contain a polymerizable monomer.

The polymerizable monomer may be, for example, a radically polymerizable or cationically polymerizable compound. Among these, a polyfunctional radically polymerizable monomer is preferable. Further, as the polymerizable monomer, a copolymerizable monomer which is copolymerized with the liquid crystal compound having the above-mentioned polymerizable group is preferable. Examples of the polymerizable monomer include polymerizable monomers described in paragraphs [0018] to [0020] of JP2002-296423A.

The content of the polymerizable monomer in the composition is preferably 0.1% to 50% by mass and more preferably 0.5% to 30% by mass with respect to the total mass of the polymerizable liquid crystal compound.

Further, the composition may include a surfactant.

Examples of the surfactant include conventionally known compounds, and a fluorine-based compound is particularly preferable. Examples of the surfactant include the compounds described in paragraphs [0028] to [0056] of JP2001-330725A and the compounds described in paragraphs [0069] to [0126] of JP2003-295212.

Further, the composition may include a solvent. An organic solvent is preferably used as the solvent. Examples of the organic solvent include an amide (for example, N,N-dimethylformamide), a sulfoxide (for example, dimethyl sulfoxide), a heterocyclic compound (for example, pyridine), a hydrocarbon (for example, benzene or hexane), an alkyl halide (for example, chloroform or dichloromethane), an ester (for example, methyl acetate, ethyl acetate, or butyl acetate), a ketone (for example, acetone or methyl ethyl ketone), and an ether (for example, tetrahydrofuran or 1,2-dimethoxyethane). Two or more kinds of organic solvents may be used in combination.

Further, the composition may contain various alignment controlling agents such as a vertical alignment agent and a horizontal alignment agent. These alignment controlling agents are compounds capable of controlling the alignment of the liquid crystal compound horizontally or vertically on the interface side.

Further, the composition may include an ultraviolet absorber, an adhesion improver, a plasticizer, a polymer and the like in addition to the above-mentioned components. Examples of the ultraviolet absorber include a benzophenone derivative, a salicylic acid ester derivative, a triazine derivative, a triazole derivative, and an acrylonitrile derivative.

The used support is a member having a function as a base material for applying the composition. The support may be a temporary support which is peeled off after the composition is applied and cured.

As the support (temporary support), in addition to a plastic film, a glass substrate or the like may be used. Examples of materials constituting the plastic film include polyester resins such as polyethylene terephthalate (PET), polycarbonate resins, (meth)acrylic resins, epoxy resins, polyurethane resins, polyamide resins, polyolefin resins, cellulose derivatives, silicone resins, and polyvinyl alcohol (PVA).

The thickness of the support may be about 5 to 1000 μm and is preferably 10 to 250 μm and more preferably 15 to 90 μm.

If necessary, an alignment film may be arranged on the support.

The alignment film generally contains a polymer as a main component. Polymers for alignment films are described in many documents, and many commercial products are available. The polymer to be used is preferably polyvinyl alcohol, polyimide, or a derivative thereof. In the side chain of the polymer, substituents such as an amide group, a sulfoxide group, a hetero ring group, an alicyclic group, an aromatic ring group, a non-aromatic hydrocarbon group, an alkyl hydride group, an ester group, a ketone group, an ether group, and a polymerizable group may be included.

A composition for forming an alignment film (alignment film forming composition) may include a polymerization initiator. The polymerization initiator to be used is selected according to the type of polymerization reaction and for example, a thermal polymerization initiator and a photopolymerization initiator may be used. Examples of the photopolymerization initiator include an α-carbonyl compound, acyloin ether, an α-hydrocarbon-substituted aromatic acyloin compound, a polynuclear quinone compound, and a combination of triarylimidazole dimer and p-aminophenyl ketone.

The content of the polymerization initiator in the alignment film forming composition is preferably 0.01% to 20% by mass and more preferably 0.5% to 10% by mass with respect to the total solid content of the alignment film forming composition.

From the viewpoint of durability, before the liquid crystal compound is applied, the alignment film may be subjected to a crosslinking treatment. The crosslinking method is selected from the type of reaction and for example, thermal crosslinking and photocrosslinking may be adopted.

In addition, it is preferable that the alignment film is subjected to a known rubbing treatment.

In the present invention, since it is possible to prevent surface deterioration by not allowing contact with the surface of the alignment film at the time of formation of the alignment film, as the alignment film, a photo alignment film is preferably used. Examples of the alignment film include photo alignment films described in paragraphs 0022 to 0029 of JP2015-227947A.

The thickness of the alignment film is preferably 0.01 to 10 μm and more preferably 0.01 to 1 μm.

Examples of the method for applying the composition include known methods such as a curtain coating method, a dip coating method, a spin coating method, a printing coating method, a spray coating method, a slot coating method, a roll coating method, a slide coating method, a blade coating method, a gravure coating method, and a wire bar method.

Next, the coating film formed on the support is subjected to an alignment treatment to align the polymerizable liquid crystal compound in the coating film.

The alignment treatment can be performed by drying the coating film at room temperature or by heating the coating film. In the case of a thermotropic liquid crystal compound, generally, the liquid crystal phase formed by the alignment treatment can be transferred by changing temperature or pressure. In the case of a liquid crystal compound having lyotropic properties, the liquid crystal phase can be transferred by the compositional ratio such as the amount of a solvent.

The conditions of the case of heating the coating film are not particularly limited. However, the heating temperature is preferably 50° C. to 150° C. and the heating time is preferably 10 seconds to 5 minutes.

Next, a curing treatment is performed on the coating film in which the polymerizable liquid crystal compound is aligned.

The method of the curing treatment performed on the coating film in which the polymerizable liquid crystal compound is aligned is not particularly limited, and examples thereof include a photoirradiation treatment and a heating treatment. Among these, from the viewpoint of production suitability, a photoirradiation treatment is preferable and an ultraviolet irradiation treatment is more preferable.

The irradiation conditions for the photoirradiation treatment are not particularly limited and the irradiation amount is preferably 50 to 1000 mJ/cm$^2$.

In addition, the phase difference layer may include a adhesion layer (for example, a pressure sensitive adhesive layer and an adhesive layer) for closely attaching the λ/2 plate, the λ/4 plate, and the positive C-plate. The phase difference layer may have a multilayer structure in which an optically anisotropic layer is directly formed on the surface of each optically anisotropic layer without including a adhesion layer.

(Other Layers)

Further, the circularly polarizing plate may have a polarizer protective film on the surface of the linear polarizer. The polarizer protective film may be arranged only on one surface of the linear polarizer or may be arranged on both surfaces of the linear polarizer.

The configuration of the polarizer protective film is not particularly limited, and may be, for example, a so-called transparent support, a hardcoat layer, or a laminate of a transparent support and a hardcoat layer.

A known layer can be used as a hardcoat layer and the hardcoat layer may be, for example, a layer obtained by polymerizing and curing the above-mentioned polyfunctional monomer.

Further, as a transparent support, a known transparent support can be used. For example, as the material for forming the transparent support, a cellulose-based polymer typified by triacetyl cellulose (hereinafter, referred to as cellulose acylate), a thermoplastic norbornene resin (ZEONEX and ZEONOR manufactured by Zeon Corporation, ARTON manufactured by JSR Corporation, or the like), an acrylic resin, or a polyester resin may be used.

The thickness of the polarizer protective film is not particularly limited and from the viewpoint of being capable of reducing the thickness of the organic EL display device, the thickness is preferably 40 μm or less and more preferably 25 μm or less. The lower limit is not particularly limited and is 5 μm or more in many cases.

In addition, in order to protect adhesiveness between each layer, a pressure sensitive adhesive layer or an adhesive layer may be arranged between each layer. Further, a transparent support may be arranged between each layer.

The thickness (entire thickness) of the circularly polarizing plate is not particularly limited but from the viewpoint of thickness reduction, the thickness is preferably 100 μm or less and more preferably 60 μm or less. The lower limit is not particularly limited but in most cases, the thickness is usually 20 μm or more.

The thickness of the circularly polarizing plate is measured using a contact-type film thickness meter (manufactured by Anritsu Corporation) and an average value of thickness values measured at 5 points with equal intervals is used as the thickness.

<First Adhesion Layer>

The first adhesion layer is a layer used for laminating the above-described circularly polarizing plate and the organic EL display panel described later. In a case where other layers such as a barrier film, a touch panel, and a hardcoat layer are provided between the circularly polarizing plate and the organic EL display panel, the first adhesion layer refers to a adhesion layer arranged on the circularly polarizing plate side.

The complex modulus of elasticity of the first adhesion layer is 2.50×10$^5$ Pa or less and from the viewpoint o further reducing a change in tint at the bent portion and/or further suppressing the occurrence of cracking or peeling at the time of bending, the complex modulus of elasticity is preferably 1.50×10$^5$ Pa or less and more preferably 1.00×10$^5$ Pa or less. The lower limit is not particularly limited but is preferably 0.10×10$^5$ Pa or more from the viewpoint of handleability.

For the method of measuring the complex modulus of elasticity of the first adhesion layer, a sample of the first adhesion layer having a width of 0.5 mm, a length of 10 mm, and a thickness of 1.5 mm is set to a mounting jig, and humidity control is performed for 1 hour or longer at 25° C. and a humidity of 60%. Then, in this environment (at 25° C. and a humidity of 60%), using a dynamic viscoelasticity meter (DVA-225: by IT Keisoku Seigyo K. K.), shear deformation is performed at a frequency of 1 Hz and a strain of 0.1% to measure the complex modulus of elasticity. In a case where the first adhesion layer having the above thickness is prepared, a sample having a thickness of 1.5 mm may be directly produced or a plurality of sheets having a thickness of less than 1.5 mm may be stacked to prepare a sample. From the obtained storage modulus and loss modulus, the complex modulus of elasticity is calculated based on the following equation.

Complex modulus of elasticity={(storage modulus)$^2$+(loss modulus)$^2$}$^{0.5}$    Equation:

The first adhesion layer is thicker than the second adhesion layer. That is, the thickness of the first adhesion layer is larger than the thickness of the second adhesion layer.

A difference in thickness between the first adhesion layer and the second adhesion layer (thickness of first adhesion layer–thickness of second adhesion layer) is not particularly limited but from the viewpoint of further reducing a change in tint in the bent portion, the difference is preferably 0.5 μm or more and more preferably 20 μm or more. The upper limit of the difference in thickness is not particularly limited but is 200 μm or less in many cases.

The thickness of the first adhesion layer is not particularly limited as long as the thickness of the first adhesion layer has a predetermined relationship with the thickness of the above-described second adhesion layer. However, from the viewpoint of further reducing a change in tint in the bent portion, the thickness is preferably 200 μm or less, more preferably 100 μm or less, even more preferably 50 μm or less, and particularly preferably 30 μm or less. The lower limit is not particularly limited but is 10 μm or more in many cases.

The first adhesion layer may be a pressure sensitive adhesive layer or an adhesive layer. The adhesive layer may be a layer obtained by performing curing by light (for example, ultraviolet rays (UV)) irradiation or heating.

Although the method of forming the first adhesion layer is not particularly limited, for example, in a case of using a UV curable type adhesive, a method of applying a UV curable type adhesive to the linear polarizer to form a coating film, laminating the phase difference layer described later on the coating film, then performing UV irradiation and curing the coating film to obtain an adhesive layer may be used. In addition, in a case of using a pressure sensitive adhesive layer, a method of laminating a sheet-like pressure sensitive adhesive layer on the linear polarizer and further laminating the phase difference layer described later on the pressure sensitive adhesive layer may be used.

<Organic EL Display Panel>

The organic EL display panel is a bendable panel. Usually, a bendable organic EL display panel is bendable in a specific direction in many cases.

As such an organic EL display panel, an organic EL display panel having a known configuration can be used and usually has a structure formed by sandwiching an organic light emitting layer (organic electroluminescent layer) between electrodes (between a cathode and an anode).

<Organic EL Display Device>

The organic EL display device has the circularly polarizing plate, the first adhesion layer, and the bendable organic electroluminescent display panel. On the circularly polarizing plate or between the circularly polarizing plate and the organic EL display panel, other layers such as a barrier film, a touch panel, and a hardcoat layer may be provided.

In the organic EL display device, the absorption axis of the linear polarizer is arranged at an angle of 0°±30° or 90°±30° with respect to the extension direction of a ridge line formed in a case where the organic electroluminescent display device is bent (hereinafter, simply referred to as "ridge line direction"). That is, the linear polarizer is arranged in the organic EL display device so as to satisfy the relationship.

In the range, from the viewpoint of further reducing a change in tint in the bent portion, the absorption axis of the linear polarizer is preferably 0°+20° or 90°±20° and more preferably 0°±10° or 90°±10° with respect to the ridge line direction.

Regarding the angular position, a clockwise direction is expressed as a positive value with the ridge line direction as a reference in a case of observing the circularly polarizing plate from the normal direction of the surface of the circularly polarizing plate on the linear polarizer side.

Figure 2:
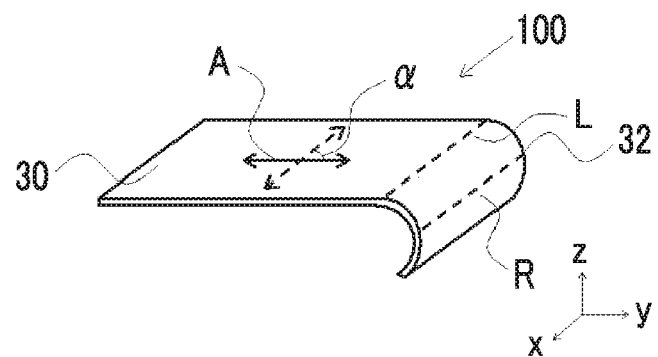
FIG. 2 is a view for illustrating a position of an absorption axis of a linear polarizer.

The ridge line direction will be more specifically described using FIG. 2. In FIG. 2, an example of an embodiment in which the organic EL display device is bent is shown. As shown in FIG. 2, an organic EL display device 100 has at least a flat portion 30 and a bent portion 32 connected to the flat portion 30 through (or separated from) a linear bending start line L (boundary line). In FIG. 2, the ridge line direction corresponds to a direction in which a ridge line R in the bent portion 32 of the organic EL display device 100 extends (x direction in FIG. 2). That is, the ridge line direction means a direction in which the ridge line formed in the bent portion in a case where the organic EL display device 100 is bent in the bent portion (line from the peak to the peak of a mountain portion) extends. In FIG. 2, it can be said that the extension direction of the ridge line R corresponds to a direction (x direction in FIG. 2) parallel to the linear bending start line L.

The linear bending start line L is a position at the end portion of the flat portion 30 and represents a position where bending starts.

As shown in FIG. 2, the angle of the absorption axis A of the linear polarizer with respect to the direction in which the ridge line R extends represents an angle expressed as an angle α in FIG. 2. In FIG. 2, an embodiment in which the angle α is about 90° is shown but as described above, the absorption axis of the linear polarizer is positioned at an angle of 0°+30° or 90°±30° with the ridge line direction as a reference.

In other words, the angle formed between the absorption axis of the linear polarizer and the ridge line direction is 0° to 30° or 60° to 120°.

Further, as shown in FIGS. 3A to 3D described later, the organic EL display device according to the embodiment of the present invention also includes an organic EL display device in a bent state (a display device in which the bending is fixed).

At least a part of the organic EL display device is preferably bent at a curvature diameter of 10 mm or less and more preferably 8 mm or less. Although a change in tint becomes large by reducing the curvature diameter, a change in tint is reduced even in the organic EL display device in a state of being bent with such a very small curvature diameter.

The organic EL display device is bent at any appropriate portion. For example, the display device may be bent at the central portion like a foldable display device (for example, FIGS. 3A and 3B), and may be bent at the end portion (for example, FIGS. 3C and 3D) from the viewpoint of securing designability and a display screen at maximum. Further, as shown in FIGS. 3A to 3D, the organic EL display device may be bent along a longitudinal direction thereof or may be bent along a lateral direction thereof. It goes without saying that a specific portion of the display device may be bent (for example, a part or all of the four corners in an oblique direction) according to the application.

As shown in FIGS. 3A to 3D, the absorption axis of the linear polarizer is adjusted so as to define the predetermined angle α with respect to the ridge line direction. The angle α is an angle of 0°±30° or 90°±30°.

Figure 3A:
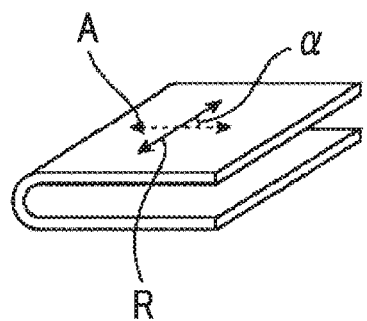
FIG. 3A is a schematic view illustrating a bent state of the organic EL display device.
Figure 3B:
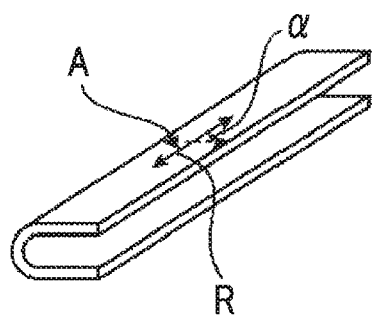
FIG. 3B is a schematic view illustrating a bent state of the organic EL display device.
Figure 3C:
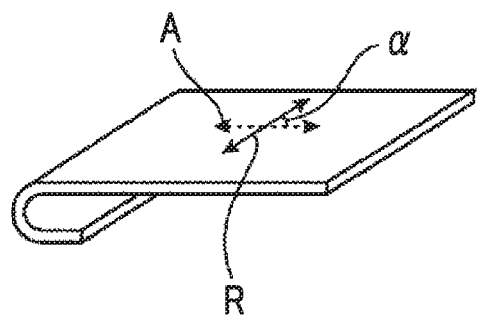
FIG. 3C is a schematic view illustrating a bent state of the organic EL display device.
Figure 3D:
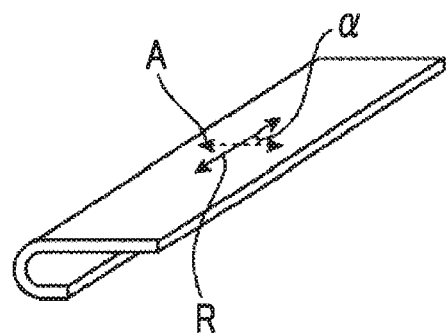
FIG. 3D is a schematic view illustrating a bent state of the organic EL display device.
Figure 3E:
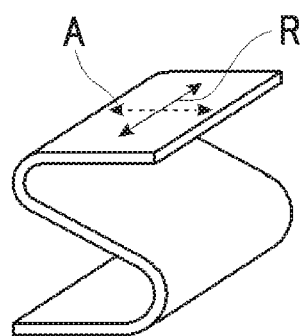
FIG. 3E is a schematic view illustrating a bent state of the organic EL display device.

In addition, although the embodiment in which the display device is bent at one place is described in FIGS. 3A to 3D, the embodiment in which the display device is bent at two or more points may be adopted as long as the embodiment satisfies the above requirements. For example, as shown in FIG. 3E, an embodiment in which the display device is bent at two places may be adopted.

In FIGS. 3A to 3E, R represents a ridge line and A represents the absorption axis of the linear polarizer.

EXAMPLES

Hereinafter, the features of the present invention will be more specifically described with reference to Examples and Comparative Examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Example 1

(Formation of Alignment Film A)

A long cellulose acylate film (TD80UL, manufactured by Fujifilm Corporation) was allowed to pass through a dielectric heating roll at a temperature of 60° C., and the film surface temperature was raised to 40° C. Then, an alkaline solution having the following composition was applied to the band surface of the film in a coating amount of 14 ml/m$^2$ using a bar coater and was transported for 10 seconds under a steam type far infrared heater manufactured by Noritake Co., Ltd., which was heated at 110° C. Subsequently, pure water was applied in 3 ml/m$^2$ to the film using the same bar coater. Next, after water washing with a fountain coater and water drainage with an air knife were repeated three times, the film was transported to a drying zone at 70° C. for 10 seconds and dried to prepare an alkali-saponified cellulose acylate film (thickness: 80 μm).

Composition of Alkaline Solution

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

To the surface of the alkali-saponified cellulose acylate film, an alignment film coating liquid A having the following composition was continuously applied using a #14 wire bar. Next, the coating film was dried with hot air at 60° C. for 60 seconds and further dried with hot air at 100° C. for 120 seconds to obtain an alignment film A (thickness: 0.5 μm).

Composition of Alignment Film Coating Liquid A

| | |
|---|---|
| Polyvinyl alcohol-1 below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Kagaku Co., Ltd.) | 0.175 parts by mass |

Polyvinyl alcohol-1

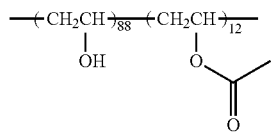

(Formation of Optically Anisotropic Layer a (Corresponding to λ/2 Plate))

The prepared alignment film A was continuously subjected to a rubbing treatment. At this time, the longitudinal direction of the long film was parallel to the transport direction, and the angle between the longitudinal direction of the film and the rotation axis of the rubbing roller was set to 72.5° (in a case where the width direction of the film was set to 0°, the longitudinal direction of the film was set to 90° and the clockwise direction was expressed as a positive value with the width direction of the film as a reference when observed from the alignment film A side, the angle of the rotational axis of the rubbing roller was −17.5°).

An optically anisotropic layer A coating liquid containing a discotic liquid crystal compound having the following composition was continuously applied to the prepared alignment film A using a #4.8 wire bar. The transport speed of the film was set to 26 m/min. For drying of the solvent of the coating liquid and alignment aging of the discotic liquid crystal compound, the coating film on the alignment film A was heated with hot air at 130° C. for 90 seconds, then heated with hot air at 100° C. for 60 seconds and irradiated with ultraviolet rays (UV) of 300 mJ/cm² at 80° C. to fix the alignment of the liquid crystal compound. Thus, an optically anisotropic layer A was obtained. The thickness of the optically anisotropic layer A was 2.0 μm. It was confirmed that the average tilt angle with respect to the film surface of the disc plane of the discotic liquid crystal compound was 900 and the discotic liquid crystal compound was aligned vertically to the film surface. In addition, in a case where the angle of the slow axis was parallel to the rotation axis of the rubbing roller and the width direction of the film was set to 0° (the longitudinal direction of the film was 90° and the clockwise direction was expressed as a positive value with the width direction of the film as a reference when observed from the optically anisotropic layer A side), the angle of the rotation axis was −17.5°. The in-plane retardation of the optically anisotropic layer A at a wavelength of 550 nm is 240 nm and the optically anisotropic layer A exhibits forward wavelength dispersibility.

Composition of Optically Anisotropic Layer A Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |
| Photopolymerization initiator (IRGACURE 907, manufactured by BASF) | 4 parts by mass |
| Methyl ethyl ketone | 200 parts by mass |

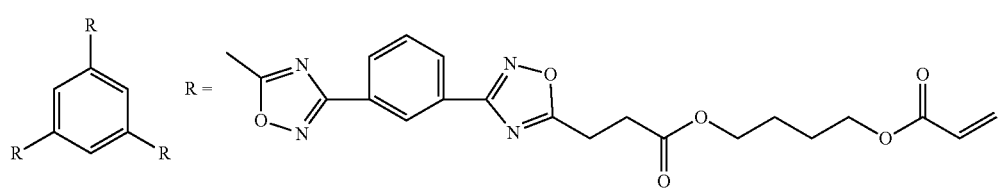

Discotic liquid crystal-1

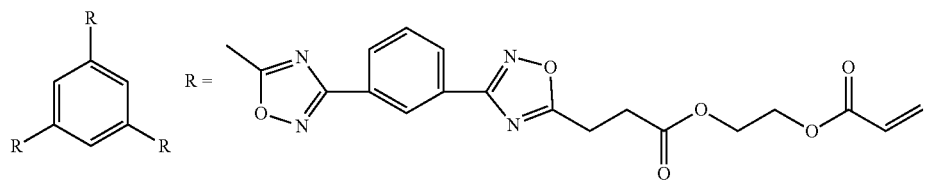

Discotic liquid crystal-2

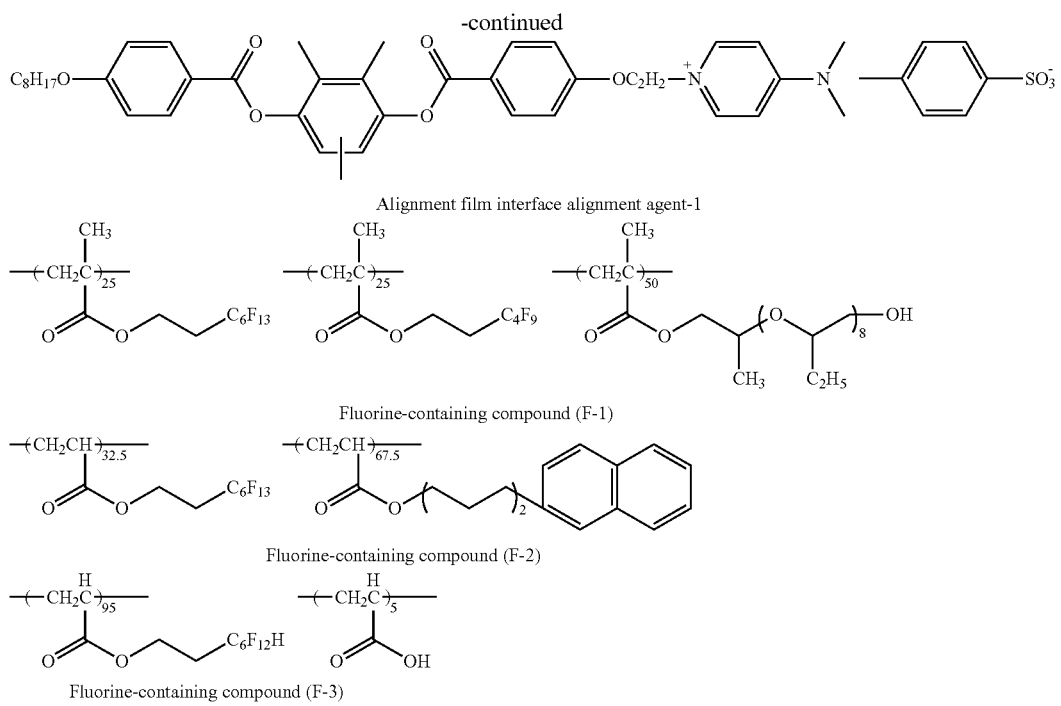

(Formation of Optically Anisotropic Layer B (Corresponding to λ/4 Plate))

The prepared alignment film A was continuously subjected to a rubbing treatment. At this time, the longitudinal direction of the long film was parallel to the transport direction, and the angle between the longitudinal direction of the film and the rotation axis of the rubbing roller was set to 77.5° (in a case where the width direction of the film was set to 0°, the longitudinal direction of the film was set to 90°, and the clockwise direction was expressed as a positive value with the width direction of the film as a reference when observed from the alignment film side, the angle of the rotational axis of the rubbing roller was 12.5°).

An optically anisotropic layer B coating liquid including a discotic liquid crystal compound having the following composition was continuously applied to the prepared alignment film A using a #2.8 wire bar. The transport speed of the film was set to 26 nm/min. For drying of the solvent of the coating liquid and alignment aging of the discotic liquid crystal compound, the coating film on the alignment film A was heated with hot air at 130° C. for 90 seconds, then heated with hot air at 100° C. for 60 seconds and irradiated with ultraviolet rays (UV) of 300 mJ/cm² at 80° C. to fix the alignment of the liquid crystal compound. Thus, an optically anisotropic layer B was formed. The thickness of the optically anisotropic layer B was 1.0 μm. It was confirmed that the average tilt angle with respect to the film surface of the disc plane of the discotic liquid crystal compound was 90° and the discotic liquid crystal compound was aligned vertically to the film surface. In addition, in a case where the angle of the slow axis was parallel to the rotation axis of the rubbing roller and the width direction of the film was set to 0° (the longitudinal direction of the film was 90° and the clockwise direction with the width direction of the film as a reference when observed from the optically anisotropic layer B side was expressed as a positive value), the angle of the rotation axis was −77.5°. The in-plane retardation of the optically anisotropic layer B at a wavelength of 550 nm is 120 nm and the optically anisotropic layer B exhibits forward wavelength dispersibility.

Composition of Optically Anisotropic Layer B Coating Liquid

| | |
|---|---|
| Discotic liquid crystal-1 | 80 parts by mass |
| Discotic liquid crystal-2 | 20 parts by mass |
| Alignment film interface alignment agent-1 | 0.6 parts by mass |
| Fluorine-containing compound (F-1) | 0.2 parts by mass |
| Fluorine-containing compound (F-2) | 0.1 parts by mass |
| Fluorine-containing compound (F-3) | 0.1 parts by mass |
| Ethylene oxide modified trimethylolpropane triacrylate | 10 parts by mass |
| Photopolymerization initiator (IRGACURE 907, manufactured by BASF) | 5 parts by mass |
| Methyl ethyl ketone | 350 parts by mass |

(Preparation of Circularly Polarizing Plate X)

A polyvinyl alcohol (PVA) film having a thickness of 80 μm was dyed by being immersed in an aqueous iodine solution having an iodine concentration of 0.05% by mass at 30° C. for 60 seconds. Next, the dyed PVA film was longitudinally stretched by 10 times its original length while being immersed in a boric acid aqueous solution having a boric acid concentration of 4% by mass for 60 seconds, and then the obtained film was dried at 50° C. for 4 minutes to obtain a linear polarizer having a thickness of 8 μm.

A commercially available cellulose acylate film "TJ25" (manufactured by Fujifilm Corporation) was prepared, the cellulose acylate film was immersed in a sodium hydroxide aqueous solution at 37° C. at 4.5 mol/liter, and then sodium hydroxide on the cellulose acylate film was sufficiently washed with water. Thereafter, the obtained cellulose acylate film was immersed in a 0.05 mol/liter dilute sulfuric acid aqueous solution for 30 seconds and then immersed in water to sufficiently wash the dilute sulfuric acid aqueous solution. Thereafter, the obtained cellulose acylate film was dried at 70° C. for 15 seconds to prepare a polarizer protective film (thickness: 25 μm).

The prepared polarizer protective film was laminated on one surface of the prepared linear polarizer with a polyvinyl alcohol-based adhesive to prepare a polarizing plate (thickness: 33 µm) including the linear polarizer and the polarizer protective film arranged on one surface of the linear polarizer.

(Active energy ray-curable adhesive composition according to adhesive layer (2b)) described in paragraph 0184 of JP2015-011094A was applied to the surface of the linear polarizer on the side opposite to the polarizer protective film side in the prepared polarizing plate as a UV curable type adhesive to form a coating film. Next, the polarizing plate in which the coating film was arranged, and the film having the cellulose acylate film, the alignment film A, and the optically anisotropic layer A prepared above were laminated such that the coating film was closely attached to the optically anisotropic layer A. Thereafter, one surface was irradiated with ultraviolet rays (UV) of 800 mJ/cm$^2$ at 50° C. from the laminated optically anisotropic layer A side and then dried with hot air at 70° C. for 3 minutes to form a adhesion layer (thickness: 2 µm, corresponding to the second adhesion layer). The cellulose acylate film and the alignment film A were peeled off from the obtained laminated product to obtain a laminate.

Further, the UV curable adhesive was applied to the optically anisotropic layer A in the obtained laminate to form a coating film. Next, the laminated in which the coating film was arranged and the film having the cellulose acylate film, the alignment film A, and the optically anisotropic layer B prepared above were laminated such that the coating film (thickness: 2 µm) was closely attached to the optically anisotropic layer B. Thereafter, under the same production conditions as the production conditions of the adhesion layer (thickness: 2 µm corresponding to the second adhesion layer), UV irradiation and drying were performed and the cellulose acylate film and the alignment film A were peeled off from the obtained laminated product.

According to the above procedure, a circularly polarizing plate X in which the linear polarizer, the optically anisotropic layer A (λ/2 plate), and the optically anisotropic layer B (λ/4 plate) were arranged in this order was prepared. In a case where the clockwise direction was expressed as a positive value with the transmission axis of the linear polarizer as a reference (0°) when observed from the linear polarizer side, the angle of the slow axis of the λ/2 plate was −17.5° and the angle of the slow axis of the λ/4 plate was −77.5°.

That is, the angle formed between the slow axis of the optically anisotropic layer A (λ/2 plate) and the transmission axis of the linear polarizer was 17.5°, and the angle formed between the slow axis of the optically anisotropic layer A (λ/2 plate) and the slow axis of the optically anisotropic layer B (λ/4 plate) was 60°.

(Preparation of Organic EL Display Device Substrate (Corresponding to Evaluation Sample))

An organic EL display panel substitute was prepared as follows. A polyethylene terephthalate (PET) film was laminated with polyimide with an adhesive, and then laminated through a pressure sensitive adhesive such that the PET film and aluminum were adjacent to each other to prepare an organic EL display panel substitute having a structure of aluminum/PET film/polyimide. The thickness of the prepared organic EL display panel substitute was 173 µm.

Thereafter, the prepared circularly polarizing plate X was laminated on the aluminum side of the organic EL display panel substitute through a pressure sensitive adhesive layer (thickness: 100 µm, complex modulus of elasticity: 1.37× 10s Pa, corresponding to the first adhesion layer) such that the linear polarizer in the circularly polarizing plate was arranged on the viewing side and the optically anisotropic layer B was arranged on the organic EL display panel substitute side. Thus, an organic EL display device substitute was prepared.

In the prepared organic EL display device substitute, the angle of the absorption axis of the linear polarizer was 250 with respect to the extension direction of the ridge line formed in a case of bending the organic EL display device substitute (hereinafter, simply referred to as "ridge line direction of the organic EL display device substitute").

(Various Evaluations)
(Tint Evaluation after Bending)

The prepared organic EL display device substitute was bent with a curvature diameter of 3 mm with the viewing side (circularly polarizing plate side) inside, fixed and held in an environment of 65° C. and a humidity of 90% for 24 hours. Then, the organic EL display device substitute was taken out at normal temperature and normal humidity, the bending of the organic EL display device substitute was returned, the tint of the bent portion was visually observed under bright light, and the organic EL display device substitute was compared with an organic EL display device substitute that was not bent at 65° C. and a humidity of 90%. Evaluation was made such that in a case where a difference in Lint before and after bending was not visually recognized, the number was close to "10", and in a case where a difference in tint before and after bending was visually recognized, the number was close to "0". The results are shown in Table 1.

(Evaluation of Crackability/Peelability after Bending)

The organic EL display device substitute in which bending was returned was observed was compared with the organic EL display device substitute which was not bent at 65° C. and a humidity of 90% and crackability and peelability were evaluated based on the following standards. The results are shown in Table 1.

A: No cracking and peeling occur in the organic EL display device substitute.

B: Cracking or peeling occurs in a part of the organic EL display device substitute.

C: Cracking or peeling occurs in the most of the organic EL display device substitute.

(Durability Evaluation)

The prepared organic EL display device substitute was stored in an environment of 60° C. and a humidity of 90% for 500 hours, the organic EL display device substitute was then taken out at normal temperature and normal humidity, and the visibility was evaluated under bright light. The prepared organic EL display device substitute was compared with the organic EL display device substitute which was not treated at 60° C. and a humidity of 90% and the durability was evaluated based on the following standards. The results are shown in Table 1.

A: A difference before and after durability evaluation is not visually recognized.

B: Although the difference before and after durability evaluation is visually recognized, the difference is very small.

C: The difference before and after durability evaluation is large.

(Evaluation of 45° Reflection Tint)

The visibility of the prepared organic EL display device substitute was evaluated under bright light. The reflected light when a fluorescent lamp was reflected from the front and a polar angle of 45° was observed, and the visibility at a polar angle of 45° was evaluated based on the following standards in comparison with the front. The results are shown in Table 1.

A: A difference in tint in the front and the oblique direction is visually recognized but is very small.

B: A difference in tint in the front and the oblique direction is visually recognized.

C: A difference in tint in the front and the oblique direction is large.

D: A difference in tint in the front and the oblique direction is very large and the amount of reflected light is also large.

Example 2

An organic EL display device substrate was prepared according to the same procedure as in Example 1 except that the direction of the absorption axis of the linear polarizer with respect to the ridge line direction of the organic EL display device substrate was changed from 25° to 115°, and various evaluations were performed. The results are shown in Table 1.

Example 3

An organic EL display device substrate was prepared according to the same procedure as in Example 1 except that the direction of the absorption axis of the linear polarizer with respect to the ridge line direction of the organic EL display device substrate was changed from 25° to 15°, and various evaluations were performed. The results are shown in Table 1.

Example 4

An organic EL display device substrate was prepared according to the same procedure as in Example 1 except that the direction of the absorption axis of the linear polarizer with respect to the ridge line direction of the organic EL display device substrate was changed from 25° to 105°, and various evaluations were performed. The results are shown in Table 1.

Example 5

An organic EL display device substrate was prepared according to the same procedure as in Example 1 except that the direction of the absorption axis of the linear polarizer with respect to the ridge line direction of the organic EL display device substrate was changed from 25° to 0°, and various evaluations were performed. The results are shown in Table 1.

Example 6

An organic EL display device substrate was prepared according to the same procedure as in Example 1 except that the direction of the absorption axis of the linear polarizer with respect to the ridge line direction of the organic EL display device substrate was changed from 25° to 90°, and various evaluations were performed. The results are shown in Table 1.

Example 7

An organic EL display device substrate was prepared according to the same procedure as in Example 1 except that the complex modulus of elasticity of the pressure sensitive adhesive layer between the circularly polarizing plate and the organic EL display panel substrate was changed from $1.37 \times 10^5$ Pa to $1.91 \times 10^5$ Pa, and various evaluations were performed. The results are shown in Table 1.

Example 8

An organic EL display device substrate was prepared according to the same procedure as in Example 5 except that the complex modulus of elasticity of the pressure sensitive adhesive layer between the circularly polarizing plate and the organic EL display panel substrate was changed from $1.37 \times 10^5$ Pa to $1.91 \times 10^5$ Pa, and various evaluations were performed. The results are shown in Table 1.

Example 9

An organic EL display device substrate was prepared according to the same procedure as in Example 1 except that the complex modulus of elasticity of the pressure sensitive adhesive layer between the circularly polarizing plate and the organic EL display panel substrate was changed from $1.37 \times 10^5$ Pa to $0.59 \times 10^5$ Pa, and various evaluations were performed. The results are shown in Table 1.

Example 10

An organic EL display device substrate was prepared according to the same procedure as in Example 5 except that the complex modulus of elasticity of the pressure sensitive adhesive layer between the circularly polarizing plate and the organic EL display panel substrate was changed from $1.37 \times 10^5$ Pa to $0.59 \times 10^5$ Pa, and various evaluations were performed. The results are shown in Table 1.

Example 11

An organic EL display device substrate was prepared according to the same procedure as in Example 6 except that the complex modulus of elasticity of the pressure sensitive adhesive layer between the circularly polarizing plate and the organic EL display panel substrate was changed from $1.37 \times 10^5$ Pa to $0.59 \times 10^5$ Pa, and various evaluations were performed. The results are shown in Table 1.

Example 12

An organic EL display device substrate was prepared according to the same procedure as in Example 10 except that instead of using the circularly polarizing plate X, a circularly polarizing plate X1 prepared according to the following procedure was used, and various evaluations were performed. The results are shown in Table 1.

(Preparation of Optically Anisotropic Layer A1 (Corresponding to λ/2 Plate))

An optically anisotropic layer A1 was prepared according to the same procedure as in Example 1 except that instead of using the optically anisotropic layer A coating liquid, the following optically anisotropic layer A1 coating liquid was used. The thickness of the optically anisotropic layer A1 was 2.0 μm. It was confirmed that the average tilt angle with respect to the film surface of the disc plane of the discotic liquid crystal compound was 90°, and the discotic liquid crystal compound was arranged vertical to the film surface. In addition, in a case where the angle of the slow axis was parallel to the rotation axis of the rubbing roller and the width direction of the film was set to 0° (the longitudinal direction of the film was set to 90°), the angle was −17.5°. The in-plane retardation of the optically anisotropic layer A1 at a wavelength of 550 nm is 240 nm and the optically anisotropic layer A1 exhibits forward wavelength dispersibility.

Composition of Optically Anisotropic Layer A1 Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Alignment film interface alignment agent-2 | 0.05 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |
| Photopolymerization initiator (IRGACURE 907, manufactured by BASF) | 4 parts by mass |
| Methyl ethyl ketone | 200 parts by mass |

Alignment film interface alignment agent-2

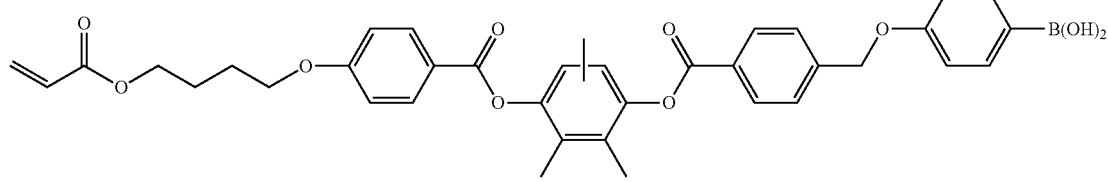

(Formation of Optically Anisotropic Layer B1 (Corresponding to λ/4 Plate))

An optically anisotropic layer B1 is prepared according to the same procedure as in Example 1 except that instead of using the optically anisotropic layer B coating liquid, the following optically anisotropic layer B1 coating liquid was used. The thickness of the optically anisotropic layer B1 was 1.0 μm. It was confirmed that the average tilt angle with respect to the film surface of the disc plane of the discotic liquid crystal compound was 90°, and the discotic liquid crystal compound was arranged vertical to the film surface. In addition, in a case where the angle of the slow axis was orthogonal to the rotation axis of the rubbing roller and the width direction of the film was set to 0° (the longitudinal direction of the film was set to 90°), the angle was −77.5°. The in-plane retardation of the optically anisotropic layer B at a wavelength of 550 nm is 120 nm and the optically anisotropic layer B exhibits forward wavelength dispersibility.

Composition of Optically Anisotropic Layer B1 Coating Liquid

| | |
|---|---|
| Discotic liquid crystal-1 | 80 parts by mass |
| Discotic liquid crystal-2 | 20 parts by mass |
| Alignment film interface alignment agent-1 | 0.6 parts by mass |
| Alignment film interface alignment agent-2 | 0.05 parts by mass |
| Fluorine-containing compound (F-1) | 0.2 parts by mass |
| Fluorine-containing compound (F-2) | 0.1 parts by mass |
| Fluorine-containing compound (F-3) | 0.1 parts by mass |
| Ethylene oxide modified trimethylolpropane triacrylate | 10 parts by mass |
| Photopolymerization initiator (IRGACURE 907, manufactured by BASF) | 5 parts by mass |
| Methyl ethyl ketone | 350 parts by mass |

(Preparation of Circularly Polarizing Plate X1)

A circularly polarizing plate X1 was prepared according to the same procedure as the preparation procedure of the circularly polarizing plate X except that instead of using the optically anisotropic layer A, the optically anisotropic layer A1 was used, instead of using the optically anisotropic layer B, the optically anisotropic layer B1 was used, and the cellulose acylate film and the alignment film were not respectively peeled off. That is, in the circularly polarizing plate X1, the polarizer, the adhesion layer, the optically anisotropic layer A1 (λ/2 plate), then alignment film A, the cellulose acylate film, the adhesion layer, the optically anisotropic layer B14 (λ/4 plate), the alignment film A, and the cellulose acylate film were arranged in this order.

Example 13

An organic EL display device substitute was prepared according to the same procedure as in Example 10 except that instead of using the circularly polarizing plate X, a circularly polarizing plate X2 prepared according to the following procedure was used, and various evaluations were performed. The results are shown in Table 1.

(Formation of Alignment Film B) An alignment film coating liquid B having the following composition was continuously applied to the surface of the alkali-saponified cellulose acylate film prepared in Example 1 using a #14 wire bar. Next, the coating film was dried with hot air at 60° C. for 60 seconds and further dried with hot air at 100° C. for 120 seconds to obtain an alignment film B (thickness: 0.5 μm).

Composition of Alignment Film Coating Liquid B

| | |
|---|---|
| Polyvinyl alcohol-2 below | 10 parts by mass |
| Water | 371 parts by mass |
| Methanol | 119 parts by mass |
| Photopolymerization initiator IRGACURE 2959, manufactured by BASF | 0.5 parts by mass |
| Glutaraldehyde (crosslinking agent) | 0.5 parts by mass |
| Citric acid ester (manufactured by Sankyo Kagaku Co., Ltd.) | 0.175 parts by mass |

Polyvinyl alcohol-2

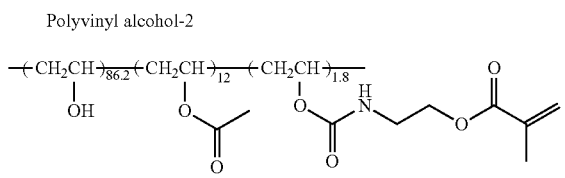

(Preparation of Optically Anisotropic Layer A2 (Corresponding to λ/2 Plate))

An optically anisotropic layer A2 was prepared according to the same procedure as in Example 1 except that instead of using the alignment film A, the alignment film B was used, and instead of using the optically anisotropic layer A coating liquid, the optically anisotropic layer A1 coating liquid was used.

(Preparation of Optically Anisotropic Layer B2 (Corresponding to λ/4 Plate))

An optically anisotropic layer B2 was prepared according to the same procedure as in Example 1 except that instead of using the alignment film A, the alignment film B was used.

(Preparation of Circularly Polarizing Plate X2)

A circularly polarizing plate X2 was prepared according to the same procedure as the preparation procedure of the circularly polarizing plate X except that instead of using the optically anisotropic layer A, the optically anisotropic layer A2 was used, instead of using the optically anisotropic layer B, the optically anisotropic layer B2 was used, and the cellulose acylate film and the alignment film B were not respectively peeled off. That is, in the circularly polarizing plate X2, the polarizer, the adhesion layer, the optically anisotropic layer A2 (λ/2 plate), then alignment film B, the cellulose acylate film, the adhesion layer, the optically anisotropic layer B2 (λ/4 plate), the alignment film B, and the cellulose acylate film were arranged in this order.

Example 14

An organic EL display device substitute was prepared according to the same procedure as in Example 10 except that instead of using the circularly polarizing plate X, a circularly polarizing plate X3 prepared according to the following procedure was used, and various evaluations were performed. The results are shown in Table 1.

(Preparation of Optically Anisotropic Layer A3 (Corresponding to λ/2 Plate))

An optically anisotropic layer A3 was prepared according to the same procedure as in Example 1 except that instead of using the alignment film A, the alignment film B was used, and instead of using the optically anisotropic layer A coating liquid, the following optically anisotropic layer A2 coating liquid was used.

Composition of Optically Anisotropic Layer A2 Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Alignment film interface alignment agent-2 | 0.05 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |

-continued

| | |
|---|---|
| Polymerizable compound-1 | 0.5 parts by mass |
| Ultraviolet absorber (Tinuvin1577FF, manufactured by BASF) | 5 parts by mass |
| Photopolymerization initiator (IRGACURE 907, manufactured by BASF) | 4 parts by mass |
| Methyl ethyl ketone | 200 parts by mass |

Polymerizable compound-1

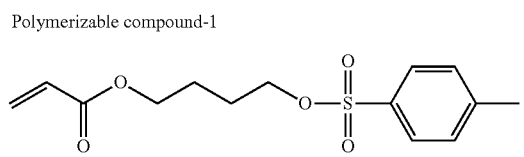 [SMILES: C=CC(=O)OCCCCOS(=O)(=O)c1ccc(C)cc1]

(Preparation of Circularly Polarizing Plate X3)

A circularly polarizing plate X3 was prepared according to the same procedure as the preparation procedure of the circularly polarizing plate X except that instead of using the optically anisotropic layer A, the optically anisotropic layer A3 was used, instead of using the optically anisotropic layer B, the optically anisotropic layer B2 was used, and the cellulose acylate film and the alignment film B were not respectively peeled off That is, in the circularly polarizing plate X2, the polarizer, the adhesion layer, the optically anisotropic layer A3 (λ/2 plate), the alignment film B, the cellulose acylate film, the adhesion layer, the optically anisotropic layer B2 (λ/4 plate), the alignment film B, and the cellulose acylate film were arranged in this order.

Example 15

An organic EL display device substitute was prepared according to the same procedure as in Example 10 except that instead of using the circularly polarizing plate X, a circularly polarizing plate X4 prepared according to the following procedure was used, and various evaluations were performed. The results are shown in Table 1.

(Preparation of Optically Anisotropic Layer A4 (Corresponding to λ/2 Plate))

An optically anisotropic layer A4 was prepared according to the same procedure as in Example 1 except that the angle of the slow axis direction of the optically anisotropic layer A4 was changed from −17.5° to 17.5°.

(Preparation of Circularly Polarizing Plate X4)

The UV curable type adhesive was applied to the surface of the optically anisotropic layer A4 side opposite to the cellulose acylate film of the prepared optically anisotropic layer A4 to form a coating film. Next, the optically anisotropic layer A4 on which the coating film was arranged and the film having the cellulose acylate film, the alignment film A, and the optically anisotropic layer B prepared above were laminated such that the coating film was closely attached to the optically anisotropic layer B. Thereafter, one surface was irradiated with ultraviolet rays (UV) of 800 mJ/cm$^2$ at 50° C. from the laminated optically anisotropic layer B side, and then dried with hot air at 70° C. for 3 minutes to form a adhesion layer. From the obtained laminated product, the cellulose acylate film and the alignment film A on the optically anisotropic layer A4 side were peeled off and thus a laminate was obtained.

Further, the UV curable type adhesive was applied to the surface of the polarizer on the side opposite to the polarizer protective film side in the prepared polarizing plate to form a coating film. Next, the polarizing plate on which the coating film was arranged and the laminate having the optically anisotropic layer A4, the adhesion layer, the optically anisotropic layer B, the alignment film A, and the cellulose acylate film prepared above were laminated such that the coating film (thickness: 2 μm) was closely attached to the optically anisotropic layer A4. Then, UV irradiation and drying were performed under the same conditions as above, and the cellulose acylate film and the alignment film A were peeled off from the obtained laminated product.

Through the above procedure, a circularly polarizing plate X4 in which the polarizer, the optically anisotropic layer A4 (λ/2 plate), and the optically anisotropic layer B (λ/4 plate) were laminated in this order was prepared. In a case where the clockwise direction was expressed as a positive value with the transmission axis of the polarizer as a reference (0°) when observed from the polarizer side, the angle of the slow axis of the X2 plate was −17.5° and the angle of the slow axis of the λ/4 plate was −77.5°.

That is, the angle formed between the slow axis of the optically anisotropic layer A4 (λ/2 plate) and the transmission axis of the polarizer was 17.5°, and the angle formed between the slow axis of the optically anisotropic layer A4 (λ/2 plate) and the slow axis of the optically anisotropic layer B (λ/4 plate) was 60°.

Example 16

An organic EL display device substitute was prepared according to the same procedure as in Example 10 except that the polarizing plate including the polarizer and the polarizer protective film arranged on one surface of the polarizer was changed to a polarizing plate including a polarizer and a polarizer protective film arranged on both surfaces of the polarizer, and various evaluations were performed. The results are shown in Table 1.

Example 17

Various evaluations were performed according to the same procedure as in Example 10 except that regarding the bending direction in (Tint Evaluation After Bending) was changed, the viewing side (circularly polarizing plate side) was changed from the inside to the outside of the bending. The results are shown in Table 1.

Example 18

Various evaluations were performed according to the same procedure as in Example 1 except that the curvature diameter in (Tint Evaluation After Bending) was changed from 3 mm to 1 mm. The results are shown in Table 1.

Example 19

Various evaluations were performed according to the same procedure as in Example 1 except that the curvature diameter in (Tint Evaluation After Bending) was changed from 3 mm to 10 mm. The results are shown in Table 1.

Example 20

An organic EL display device substitute was prepared according to the same procedure as in Example 10 except that as the second adhesion layer, a pressure sensitive adhesive layer (thickness: 13 μm) was used instead of using the UV curable type adhesive layer, and various evaluations were performed. The results are shown in Table 1.

Example 21

An organic EL display device substitute was prepared according to the same procedure as in Example 10 except that a pressure sensitive adhesive layer (thickness: 13 μm) was used between the optically anisotropic layer A and the optically anisotropic layer B instead of using the UV curable type adhesive layer, and various evaluations were performed. The results are shown in Table 1.

Example 22

An organic EL display device substitute was prepared according to the same procedure as in Example 1 except that the thickness of the pressure sensitive adhesive layer between the circularly polarizing plate and the organic EL display panel substitute was changed from 100 μm to 25 μm, and various evaluations were performed. The results are shown in Table 1.

Example 23

An organic EL display device substitute was prepared according to the same procedure as in Example 1 except that the thickness of the pressure sensitive adhesive layer between the circularly polarizing plate and the organic EL display panel substitute was changed from 100 μm to 50 μm, and various evaluations were performed. The results are shown in Table 1.

Example 24

An organic EL display device substitute was prepared according to the same procedure as in Example 1 except that the thickness of the pressure sensitive adhesive layer between the circularly polarizing plate and the organic EL display panel substitute was changed from 100 μm to 150 μm, and various evaluations were performed. The results are shown in Table 1.

Example 25

An organic EL display device substitute was prepared according to the same procedure as in Example 10 except that instead of using the circularly polarizing plate X, a circularly polarizing plate Y prepared according to the following procedure was used, and various evaluations were performed. The results are shown in Table 1.

(Preparation of Optically Anisotropic Layer C)

The alignment film A prepared in Example 1 was continuously subjected to a rubbing treatment. At this time, the longitudinal direction of the long film was parallel to the transport direction, and the angle between the longitudinal direction of the film and the rotation axis of the rubbing roller was set to 77.5° (in a case where the width direction of the film was set to 00, the longitudinal direction of the film was set to 90° and the clockwise direction was expressed as a positive value with the width direction of the film as a reference when observed from the alignment film A side, the angle of the rotational axis of the rubbing roller was 12.5°).

An optically anisotropic layer C coating liquid including a rod-like liquid crystal compound having the following composition was continuously applied to the alignment film A after the rubbing treatment using a #2.8 wire bar. The transport speed (V) of the film was set to 26 m/min. For drying of the solvent of the coating liquid and alignment aging of the rod-like liquid crystal compound, the coating film on the alignment film A was heated with hot air at 60° C. for 60 seconds and irradiated with UV at 60° C. to fix the alignment of the liquid crystal compound. Thus, an optically anisotropic layer C was formed. The thickness of the optically anisotropic layer C was 1.0 µm. It was confirmed that the average tilt angle with respect to the film surface of the long axis of the rod-like liquid crystal compound was 0° and the liquid crystal compound was arranged horizontally to the film surface. In addition, in a case where the angle of the slow axis was orthogonal to the rotation axis of the rubbing roller the width direction of the film was set to 0° (the longitudinal direction of the film was set to 90° and the clockwise direction was expressed as a positive value with the width direction of the film as a reference when observed from the optically anisotropic layer C side), the angle was −77.5°. The in-plane retardation of the optically anisotropic layer C at a wavelength of 550 nm is 116 nm and the optically anisotropic layer C exhibits forward wavelength dispersibility.

Composition of Optically Anisotropic Layer C Coating Liquid

| | |
|---|---|
| Mixture (A) of rod-like liquid crystal compound | 100 parts by mass |
| Photopolymerization initiator (IRGACURE 907, manufactured by BASF) | 6 parts by mass |
| Fluorine-containing compound (F-1) | 0.25 parts by mass |
| Fluorine-containing compound (F-2) | 0.3 parts by mass |
| Ethylene oxide modified trimethylolpropane triacrylate | 8 parts by mass |
| Methyl ethyl ketone | 337 parts by mass |

Example 26

An organic EL display device substitute was prepared according to the same procedure as in Example 10 except that instead of using the circularly polarizing plate X, a circularly polarizing plate Z prepared according to the following procedure was used, and various evaluations were performed. The results are shown in Table 1.

(Preparation of Optically Anisotropic Layer D)

The alignment film A prepared in Example 1 was continuously subjected to a rubbing treatment. At this time, the longitudinal direction of the long film was parallel to the transport direction, and the angle between the longitudinal direction of the film and the rotation axis of the rubbing roller was set to 17.5° (in a case where the width direction of the film was set to 00, the longitudinal direction of the film was set to 90° and the clockwise direction was expressed as a positive value with the width direction of the film as a reference when observed from the alignment film A side, the angle of the rotational axis of the rubbing roller was 72.5°).

An optically anisotropic layer D coating liquid including a rod-like liquid crystal compound having the following composition was continuously applied to the alignment film A after the rubbing treatment using a #4.8 wire bar. The transport speed (V) of the film was set to 26 m/min. For drying of the solvent of the coating liquid and alignment aging of the rod-like liquid crystal compound, the coating film on the alignment film A was heated with hot air at 60° C. for 60 seconds and irradiated with UV at 60° C. to fix the alignment of the liquid crystal compound. Thus, an optically anisotropic layer D was formed. The thickness of the opti- Mixture (A) of rod-like liquid crystal compound

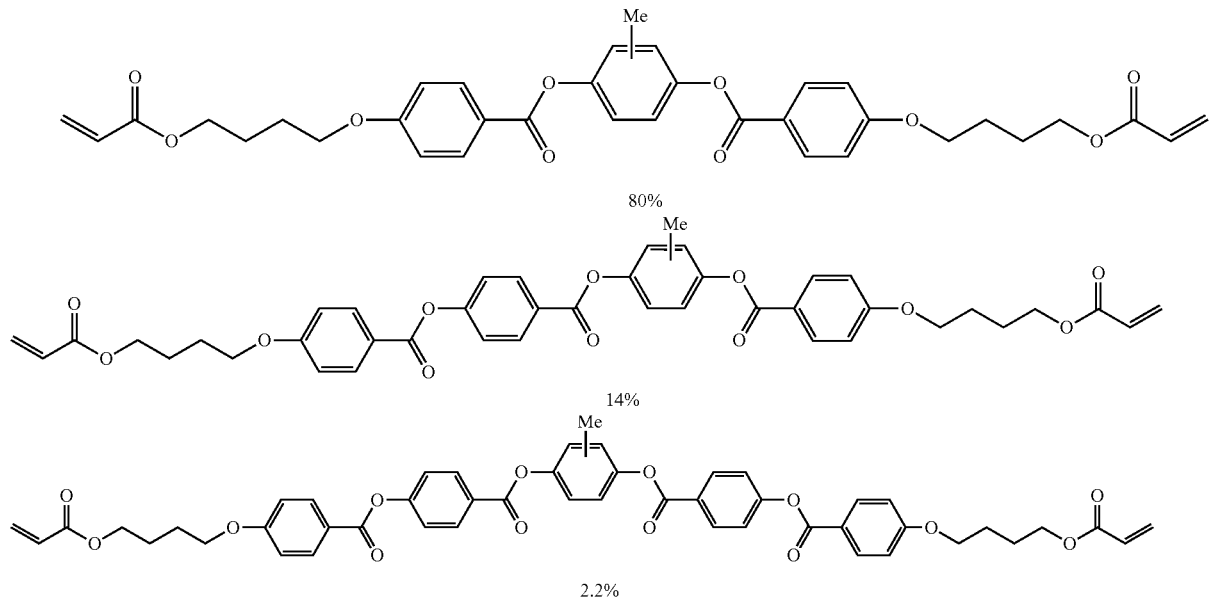

(Preparation of Circularly Polarizing Plate Y)

A circularly polarizing plate Y was prepared according to the same procedure as in Example 1 except that instead of using the optically anisotropic layer B, the optically anisotropic layer C was used.

cally anisotropic layer D was 2.0 µm. It was confirmed that the average tilt angle with respect to the film surface of the long axis of the rod-like liquid crystal compound was 0° and the liquid crystal compound was arranged horizontally to the film surface. In addition, in a case where the angle of the slow axis was orthogonal to the rotation axis of the rubbing roller and the longitudinal direction of the film was set to 90°

(the width direction of the film was set to 0°), the angle was −17.5°. The in-plane retardation of the optically anisotropic layer D at a wavelength of 550 nm is 240 nm and the optically anisotropic layer D exhibits forward wavelength dispersibility.

Composition of Optically Anisotropic Layer D Coating Liquid

| | |
|---|---|
| Mixture (A) of rod-like liquid crystal compound | 100 parts by mass |
| Photopolymerization initiator (IRGACURE 907, manufactured by BASF) | 6 parts by mass |
| Fluorine-containing compound (F-1) | 0.25 parts by mass |
| Fluorine-containing compound (F-2) | 0.3 parts by mass |
| Ethylene oxide modified trimethylolpropane triacrylate | 8 parts by mass |
| Methyl ethyl ketone | 210 parts by mass |

(Preparation of Circularly Polarizing Plate Z)

A circularly polarizing plate Z was prepared according to the same procedure as the preparation procedure of the circularly polarizing plate X except that instead of using the optically anisotropic layer A, the optically anisotropic layer D was used.

Example 27

An organic EL display device substrate was prepared according to the same procedure as in Example 10 except that instead of using the circularly polarizing plate X, a circularly polarizing plate V prepared according to the following procedure was used, and various evaluations were performed. The results are shown in Table 1.

(Preparation of Circularly Polarizing Plate V)

A circularly polarizing plate V was prepared according to the same procedure as the preparation procedure of the circularly polarizing plate X except that instead of using the optically anisotropic layer A, the optically anisotropic layer D was used, and instead of using the optically anisotropic layer B, the optically anisotropic layer C was used.

Example 28

An organic EL display device substrate was prepared according to the same procedure as in Example 10 except that instead of using the circularly polarizing plate X, a circularly polarizing plate W prepared according to the following procedure was used, and various evaluations were performed. The results are shown in Table 1.

(Preparation of Optically Anisotropic Layer G (Positive C-Plate))

An optically anisotropic layer G coating liquid including a rod-like liquid crystal compound having the following composition continuously applied to the alignment film A prepared in Example 1 using a #5.0 wire bar. The transport speed (V) of the film was set to 26 m/min. For drying of the solvent of the coating liquid and alignment aging of the rod-like liquid crystal compound, the film to which the optically anisotropic layer G coating liquid was applied was heated with hot air at 60° C. for 60 seconds. Thereafter, the obtained film was irradiated with UV at 60° C. to fix the alignment of the rod-like liquid crystal compound. Thus, an optically anisotropic layer G was prepared. The thickness of the optically anisotropic layer G was 1.0 μm and Rth(550) was −100 nm.

Composition of Optically Anisotropic Layer G Coating Liquid

| | |
|---|---|
| Rod-like liquid crystal compound-1 | 80 parts by mass |
| Rod-like liquid crystal compound-2 | 20 parts by mass |
| Photopolymerization initiator (IRGACURE 907, manufactured by BASF) | 3 parts by mass |
| Sensitizer (KAYACURE, DETX, manufactured by Nippon Kayaku Co., Ltd.) | 1 parts by mass |
| Fluorine-containing compound (F-2) | 0.3 part by mass |
| Alignment film interface alignment agent-1 | 0.55 parts by mass |
| Methyl ethyl ketone | 193 parts by mass |

[Rod-like Liquid Crystal Compound-1]

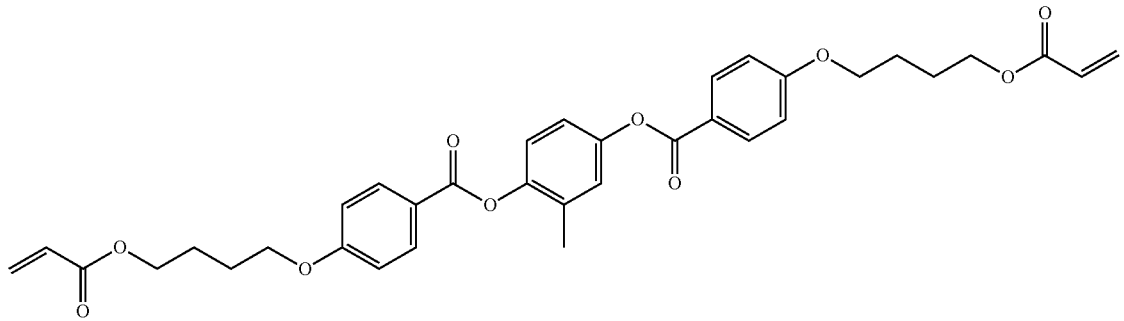

[Rod-like Liquid Crystal Compound-2]

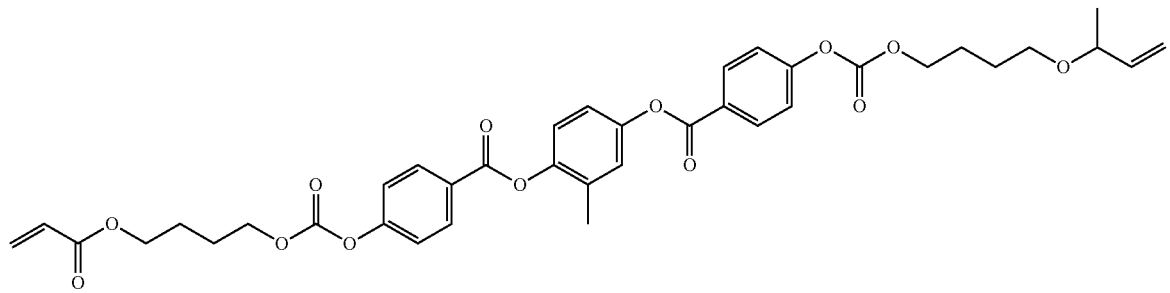

(Preparation of Circularly Polarizing Plate W)

The UV curable type adhesive was applied to the optically anisotropic layer B of the circularly polarizing plate X to form a coating film. Next, the laminate in which the coating film was arranged and the film having the cellulose acylate film, the alignment film A, and the optically anisotropic layer G prepared above were laminated such that the coating film (thickness: 2 μm) was closely attached to the optically anisotropic layer G. Thereafter, one surface was irradiated with ultraviolet rays (UV) of 800 mJ/cm$^2$ at 50° C. from the laminated optically anisotropic layer G side, and then dried with hot air at 70° C. for 3 minutes to form a adhesion layer. Then, from the obtained laminated product, the cellulose acylate film and the alignment film A were peeled off and thus a circularly polarizing plate W was obtained.

Example 29

An organic EL display device substitute was prepared according to the same procedure as in Example 10 except that instead of using the circularly polarizing plate X, a circularly polarizing plate Y1 prepared according to the following procedure was used, and various evaluations were performed. The results are shown in Table 1.

(Formation of Alignment Film C)

An alignment film coating liquid C having the following composition was continuously applied to the alkali-saponified surface of the cellulose acylate film prepared in Example 1 using a #14 wire bar. Next, the coating film was dried with hot air at 60° C. for 60 seconds and further dried with hot air at 100° C. for 120 seconds to obtain an alignment film C (thickness: 0.5 μm).

Composition of Alignment Film Coating Liquid C

| | |
|---|---|
| Polyvinyl alcohol-3 below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Kagaku Co., Ltd.) | 0.175 parts by mass |

Polyvinyl alcohol-3

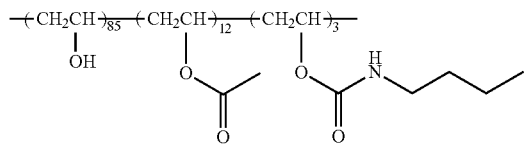

(Preparation of Optically Anisotropic Layer A5 (Corresponding to λ/2 Plate))

An optically anisotropic layer A5 was prepared according to the same procedure as in Example 1 except that instead of using the alignment film A, the alignment film C was used.

(Preparation of Optically Anisotropic Layer C1 (Corresponding to λ/4 Plate))

An optically anisotropic layer C1 was prepared according to the same procedure as in Example 25 except that instead of using the alignment film A, an alignment film C was used.

(Preparation of Circularly Polarizing Plate Y1)

A circularly polarizing plate Y1 was prepared according to the same procedure as the preparation procedure of the circularly polarizing plate X except that instead of using the optically anisotropic layer A, the optically anisotropic layer A5 was used and instead of using the optically anisotropic layer B, the optically anisotropic layer C1 was used.

Example 30

An organic EL display device substitute was prepared according to the same procedure as in Example 10 except that instead of using the circularly polarizing plate X, a circularly polarizing plate Y2 according to the following procedure was used, and various evaluations were performed. The results are shown in Table 1.

(Formation of Alignment Film D)

An alignment film coating liquid D having the following composition was continuously applied to the alkali-saponified surface of the cellulose acylate film prepared in Example 1 using a #14 wire bar. Next, the coating film was dried with hot air at 60° C. for 60 seconds and further dried with hot air at 100° C. for 120 seconds to obtain an alignment film D (thickness: 0.5 μm).

Composition of Alignment Film Coating Liquid D

| | |
|---|---|
| Polyvinyl alcohol-4 below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Kagaku Co., Ltd.) | 0.175 parts by mass |

Polyvinyl alcohol-4

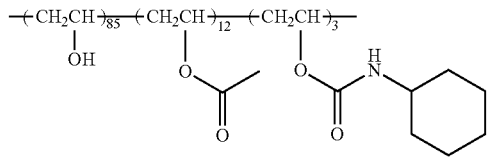

(Preparation of Optically Anisotropic Layer A6 (Corresponding to λ/2 Plate))

An optically anisotropic layer A6 was prepared according to the same procedure as in Example 1 except that instead of using the alignment film A, the alignment film D was used.

(Preparation of Optically Anisotropic Layer C2 (Corresponding to λ/4 Plate))

An optically anisotropic layer C2 was prepared according to the same procedure as in Example 25 except that instead of using the alignment film A, the alignment film D was used.

(Preparation of Circularly Polarizing Plate Y2)

A circularly polarizing plate Y2 was prepared according to the same procedure as the preparation procedure of the circularly polarizing plate X except that instead of using the optically anisotropic layer A, the optically anisotropic layer A6 was used and instead of using the optically anisotropic layer B, the optically anisotropic layer C2 was used.

Example 31

An organic EL display device substitute was prepared according to the same procedure as in Example 10 except that instead of using the circularly polarizing plate X, a circularly polarizing plate Y3 prepared according to the following procedure was used, and various evaluations were performed. The results are shown in Table 1.

(Formation of Alignment Film E)

An alignment film coating liquid E having the following composition was continuously applied to the alkali-saponified surface of the cellulose acylate film prepared in Example 1 using a #14 wire bar. Next, the coating film was dried with hot air at 60° C. for 60 seconds and further dried with hot air at 100° C. for 120 seconds to obtain an alignment film E (thickness: 0.5 µm).

Composition of Alignment Film Coating Liquid E

| | |
|---|---|
| Polyvinyl alcohol-5 below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Kagaku Co., Ltd.) | 0.175 parts by mass |

Polyvinyl alcohol-5

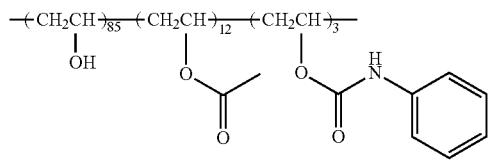

(Preparation of Optically Anisotropic Layer A7 (Corresponding to λ/2 Plate))

An optically anisotropic layer A7 was prepared according to the same procedure as in Example 1 except that instead of using the alignment film A, the alignment film E was used.

(Preparation of Optically Anisotropic Layer C3 (Corresponding to λ/4 Plate))

An optically anisotropic layer C3 was prepared according to the same procedure as in Example 25 except that instead of using the alignment film A, the alignment film E was used.

(Preparation of Circularly Polarizing Plate Y3)

A circularly polarizing plate Y3 was prepared according to the same procedure as the preparation procedure of the circularly polarizing plate X except that instead of using the alignment film A, the optically anisotropic layer A7 was used and instead of using the optically anisotropic layer B, the optically anisotropic layer C3 was used.

Example 32

An organic EL display device substitute was prepared according to the same procedure as in Example 10 except that instead of using the circularly polarizing plate X, a circularly polarizing plate Y4 prepared according to the following procedure was used, and various evaluations were performed. The results are shown in Table 1.

(Preparation of Optically Anisotropic Layer A8 (Corresponding to λ/2 Plate))

An optically anisotropic layer A8 was prepared according to the same procedure as in Example 1 except that instead of using the optically anisotropic layer A, an optically anisotropic layer A3 coating liquid was used.

Composition of Optically Anisotropic Layer A3 Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |
| Polymerizable compound-1 | 0.5 parts by mass |
| Photopolymerization initiator (IRGACURE 907, manufactured by BASF) | 4 parts by mass |
| Methyl ethyl ketone | 200 parts by mass |

(Preparation of Circularly Polarizing Plate Y4)

A circularly polarizing plate Y4 was prepared according to the same procedure as the preparation procedure of the circularly polarizing plate X except that instead of using the optically anisotropic layer A, the optically anisotropic layer A8 was used and instead of using the optically anisotropic layer B, the optically anisotropic layer C was used.

Example 33

An organic EL display device substitute was prepared according to the same procedure as in Example 10 except that instead of using the circularly polarizing plate X, a circularly polarizing plate Y5 prepared according to the following procedure was used, and various evaluations were performed. The results are shown in Table 1.

(Preparation of Optically Anisotropic Layer A9 (Corresponding to λ/2 Plate))

An optically anisotropic layer A9 was prepared according to the same procedure as in Example 1 except that instead of using the optically anisotropic layer A coating liquid, an optically anisotropic layer A4 coating liquid was used.

Composition of Optically Anisotropic Layer A4 Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |
| Hexyl p-toluenesulfonate | 0.5 parts by mass |
| Photopolymerization initiator ((IRGACURE 907, manufactured by BASF) | 4 parts by mass |
| Methyl ethyl ketone | 200 parts by mass |

(Preparation of Circularly Polarizing Plate Y5)

A circularly polarizing plate Y5 was prepared according to the same procedure as the preparation procedure of the circularly polarizing plate X except that instead of using the optically anisotropic layer A, the optically anisotropic layer A9 was used and instead of using the optically anisotropic layer B, the optically anisotropic layer C was used.

Example 34

An organic EL display device substitute was prepared according to the same procedure as in Example 10 except that instead of using the circularly polarizing plate X, a circularly polarizing plate Y6 prepared according to the following procedure was used, and various evaluations were performed. The results are shown in Table 1.

(Preparation of Optically Anisotropic Layer A10 (Corresponding to λ/2 Plate))

An optically anisotropic layer A10 was prepared according to the same procedure as in Example 1 except that instead of using the alignment film A, the alignment film C was used and instead of using the optically anisotropic layer A coating liquid, the optically anisotropic layer A3 coating liquid was used.

(Preparation of Circularly Polarizing Plate Y6)

A circularly polarizing plate Y6 was prepared according to the same procedure as the preparation procedure of the circularly polarizing plate X except that instead of using the optically anisotropic layer A, the optically anisotropic layer A10 was used and instead of using the optically anisotropic layer B, the optically anisotropic layer C1 was used.

Example 35

An organic EL display device substitute was prepared according to the same procedure as in Example 10 except that instead of using the circularly polarizing plate X, a circularly polarizing plate Y7 prepared according to the following procedure was used, and various evaluations were performed. The results are shown in Table 1.

(Preparation of Optically Anisotropic Layer a11 (Corresponding to λ/2 Plate))

An optically anisotropic layer A11 was prepared according to the same procedure as in Example 1 except that instead of using the optically anisotropic layer A coating liquid, an optically anisotropic layer A5 coating liquid was used.

Composition of Optically Anisotropic Layer A5 Coating Liquid

| | |
|---|---|
| Discotic liquid crystal-1 | 80 parts by mass |
| Discotic liquid crystal-2 | 2.0 parts by mass |
| Alignment film interface alignment agent-1 | 2 parts by mass |
| Fluorine-containing compound (F-1) | 0.2 parts by mass |
| Fiuorine-containing compound (F-2) | 0.05 parts by mass |
| Fluorine-containing compound (F-3) | 0.1 parts by mass |
| Ethylene oxide modified trimcthylolpropane triacrylate | 5 parts by mass |
| Polymerizable compound-1 | 0.5 parts by mass |
| Ultraviolet absorber (Tinuvin1577FF, manufactured by BASF) | 5 parts by mass |
| Photopolymerization initiator (IRGACURE 907, manufactured by BASF) | 4 parts by mass |
| Methyl ethyl ketone | 200 parts by mass |

(Preparation of Circularly Polarizing Plate Y7)

A circularly polarizing plate Y7 was prepared according to the same procedure as the preparation procedure of the circularly polarizing plate X except that instead of using the optically anisotropic layer A, the optically anisotropic layer A11 was used and instead of using the optically anisotropic layer B, the optically anisotropic layer C was used.

Example 36

An organic EL display device substitute was prepared according to the same procedure as in Example 10 except that instead of using the circularly polarizing plate X, a circularly polarizing plate Y8 prepared according to the following procedure was used, and various evaluations were performed. The results are shown in Table 1.

(Preparation of Optically Anisotropic Layer A12 (Corresponding to λ/2 Plate))

An optically anisotropic layer A12 was prepared according to the same procedure as in Example 1 except that instead of using the optically anisotropic layer A coating liquid, an optically anisotropic layer A6 coating liquid was used.

Composition of Optically Anisotropic Layer A6 Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |
| Polymerizable compound-1 | 0.5 parts by mass |
| Ultraviolet absorber (Tinuvin479FF, manufactured by BASF) | 5 parts by mass |
| Photopolymerization initiator (IRGACURE 907, manufactured by BASF) | 4 parts by mass |
| Methyl ethyl ketone | 200 parts by mass |

(Preparation of Circularly Polarizing Plate Y8)

A circularly polarizing plate Y8 was prepared according to the same procedure as the preparation procedure of the circularly polarizing plate X except that instead of using the optically anisotropic layer A, the optically anisotropic layer A12 was used and except that instead of using the optically anisotropic layer B, the optically anisotropic layer C was used.

Example 37

An organic EL display device substitute was prepared according to the same procedure as in Example 10 except that instead of using the circularly polarizing plate X, a circularly polarizing plate Y9 prepared according to the following procedure was used, and various evaluations were performed. The results are shown in Table 1.

(Preparation of Optically Anisotropic Layer A13 (Corresponding to λ/2 Plate))

An optically anisotropic layer A13 was prepared according to the same procedure as in Example 1 except that instead of using the optically anisotropic layer A coating liquid, an optically anisotropic layer A7 coating liquid was used.

Composition of Optically Anisotropic Layer A7 Coating Liquid

| | |
|---|---|
| Discotic liquid crystal-1 | 80 parts by mass |
| Discotic liquid crystal-2 | 20 parts by mass |
| Alignment film interface alignment agent-1 | 2 parts by mass |
| Fluorine-containing compound (F-1) | 0.2 parts by mass |
| Fluorine-containing compound (F-2) | 0.05 parts by mass |
| Fluorine-containing compound (F-3) | 0.1 parts by mass |
| Ethylene oxide modified trimethylolpropane triacrylate | 5 parts by mass |
| Polymerizable compound-1 | 0.5 parts by mass |
| Ultraviolet absorber (ADEKA STAB LA-F70, manufactured by ADEKA) | 5 parts by mass |
| Photopolymerization initiator (IRGACURE 907, manufactured by BASF) | 4 parts by mass |
| Methyl ethyl ketone | 200 parts by mass |

(Preparation of Circularly Polarizing Plate Y9)

A circularly polarizing plate Y9 was prepared according to the same procedure as the preparation procedure of the circularly polarizing plate X except that instead of using the optically anisotropic layer A, the optically anisotropic layer A13 was used and instead of using the optically anisotropic layer B, the optically anisotropic layer C was used.

Example 38

An organic EL display device substitute was prepared according to the same procedure as in Example 10 except that instead of using the circularly polarizing plate X, a circularly polarizing plate Y10 prepared according to the following procedure was used, and various evaluations were performed. The results are shown in Table 1.

(Preparation of Optically Anisotropic Layer C4 (Corresponding to λ/4 Plate))

An optically anisotropic layer C4 was prepared according to the same procedure as in Example 25 except that instead of using the optically anisotropic layer C coating liquid, an optically anisotropic layer C1 coating liquid was used.

Composition of Optically Anisotropic Layer C1 Coating Liquid

| | |
|---|---|
| Mixture (A) of rod-like liquid crystal compound | 80 parts by mass |
| Photopolymerization initiator (IRGACURE 907, manufactured by BASF) | 6 parts by mass |
| Fluorme-containing compound (F-1) | 0.25 parts by mass |
| Fluorine-containing compound (F-2) | 0.3 parts by mass |
| Ethylene oxide modified trimethylolpropane triacrylate | 8 parts by mass |
| Polymerizable compound-2 | 20 parts by mass |
| Methyl ethyl ketone | 337 parts by mass |

[Polymerizable compound-2]

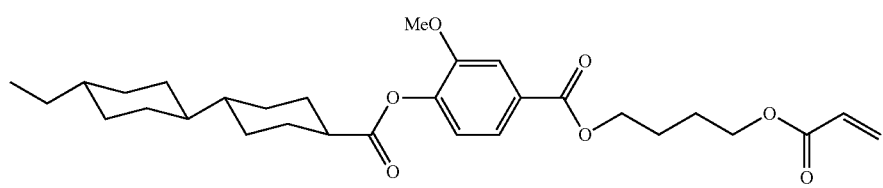

A-1

(Preparation of Circularly Polarizing Plate Y10)

A circularly polarizing plate Y10 was prepared according to the same procedure as the preparation procedure of the circularly polarizing plate X except that instead of using the optically anisotropic layer B, the optically anisotropic layer C4 was used.

Example 39

An organic EL display device substitute was prepared according to the same procedure as in Example 10 except that instead of using the circularly polarizing plate X, a circularly polarizing plate Y11 prepared according to the following procedure was used, and various evaluations were performed. The results are shown in Table 1.

(Preparation of Optically Anisotropic Layer C5 (Corresponding to λ/4 Plate))

An optically anisotropic layer C5 was prepared according to the same procedure as in Example 25 except that instead of using the optically anisotropic layer C coating liquid, an optically anisotropic layer C2 coating liquid was used.

Composition of Optically Anisotropic Layer C2 Coating Liquid

| | |
|---|---|
| Mixture (A) of rod-like liquid crystal compound | 100 parts by mass |
| Photopolymerization initiator (IRGACURE 907, manufactured by BASF) | 6 parts by mass |
| Fluorine-containing compound (F-1) | 0.25 parts by mass |
| Fluorine-containing compound (F-2) | 0.3 parts by mass |
| Tricyclodecanedimethanol diacrylate | 8 parts by mass |
| Methyl ethyl ketone | 337 parts by mass |

(Preparation of Circularly Polarizing Plate Y11)

A circularly polarizing plate Y11 was prepared according to the same procedure as the preparation procedure of the circularly polarizing plate X except that instead of using the optically anisotropic layer B, the optically anisotropic layer C5 was used.

Example 40

An organic EL display device substitute was prepared according to the same procedure as in Example 10 except that instead of using the circularly polarizing plate X, a circularly polarizing plate Y12 prepared according to the following procedure was used, and various evaluations were performed. The results are shown in Table 1.

(Preparation of Optically Anisotropic Layer C6 (Corresponding to λ/4 Plate)) An optically anisotropic layer C6 was prepared according to the same procedure as in Example 25 except that instead of using the optically anisotropic layer C coating liquid, an optically anisotropic layer C3 coating liquid was used.

Composition of Optically Anisotropic Layer C3 Coating Liquid

| | |
|---|---|
| Mixture (A) of rod-like liquid crystal compound | 80 parts by mass |
| Rod-like liquid crystal compound-2 | 20 parts by mass |
| Photopolymerization initiator (IRGACURE 907, manufactured by BASF) | 6 parts by mass |
| Fluorine-containing compound (F-1) | 0.25 parts by mass |
| Fluorine-containing compound (F-2) | 0.3 parts by mass |
| Ethylene oxide modified trimethylolpropane triacrylate | 8 parts by mass |
| Methyl ethyl ketone | 337 parts by mass |

(Preparation of Circularly Polarizing Plate Y12)

A circularly polarizing plate Y12 was prepared according to the same procedure as the preparation procedure of the circularly polarizing plate X except that instead of using the optically anisotropic layer B, the optically anisotropic layer C6 was used.

Example 41

An organic EL display device substitute was prepared according to the same procedure as in Example 1 except that instead of using the circularly polarizing plate X, a circularly polarizing plate P prepared according to the following procedure was used, and the angular relationship between the absorption axis of the linear polarizer and the slow axis of an optically anisotropic layer E was set as shown in Table 1, and various evaluations were performed. The results are shown in Table 1.

(Preparation of Optically Anisotropic Layer E)

The alignment film A prepared in Example 1 was continuously subjected to a rubbing treatment. At this time, the longitudinal direction of the long film was parallel to the transport direction, and the angle between the longitudinal direction of the film and the rotation axis of the rubbing roller was set to 45° (in a case where the width direction of the film was set to 00, the longitudinal direction of the film was set to 90° and the clockwise direction was expressed as a positive value with the width direction of the film as a reference when observed from the alignment film A side, the angle of the rotational axis of the rubbing roller was −45°).

An optically anisotropic layer E coating liquid including a rod-like liquid crystal compound having the following composition was applied to the rubbed alignment film A using a bar coater. Next, the alignment was stabilized by heating the film to 90° C. on a hot plate and then cooling the film to 60° C. Thereafter, the film was held at 60° C. and was irradiated with ultraviolet rays (UV) of 500 mJ/cm² in a nitrogen atmosphere (oxygen concentration: 100 ppm), and the alignment state thereof was fixed to form an optically anisotropic layer E. In the formed optically anisotropic layer E, a rod-like liquid crystal compound in which the slow axis direction was parallel to the rubbing direction was aligned. The thickness of the optically anisotropic layer E was 2.0 µm. The in-plane retardation of the optically anisotropic layer E at a wavelength of 550 nm is 138 nm and the optically anisotropic layer E exhibits reverse wavelength dispersibility.

Composition of Optically Anisotropic Layer E Coating Liquid

| | |
|---|---|
| Rod-like liquid crystal compound-3 | 43.75 parts by mass |
| Rod-like liquid crystal compound -4 | 43.75 parts by mass |
| Polymerizable compound-2 | 12.50 parts by mass |
| Polymerization initiator-1 (oxime type) | 3 parts by mass |
| Fluorine-containing compound (F-2) | 0.2 parts by mass |
| Methyl ethyl ketone | 219 parts by mass |

[Rod-like Liquid Crystal Compound-3]

L-1

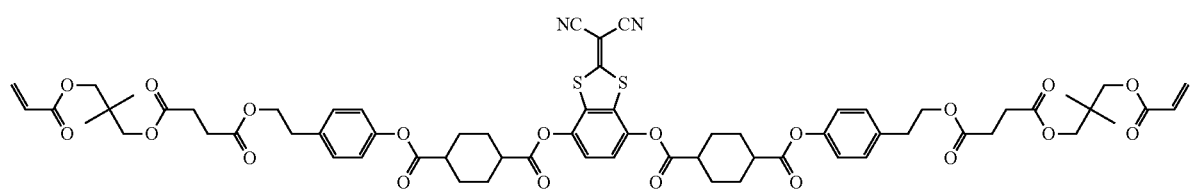

[Rod-like Liquid Crystal Compound-4]

L-2

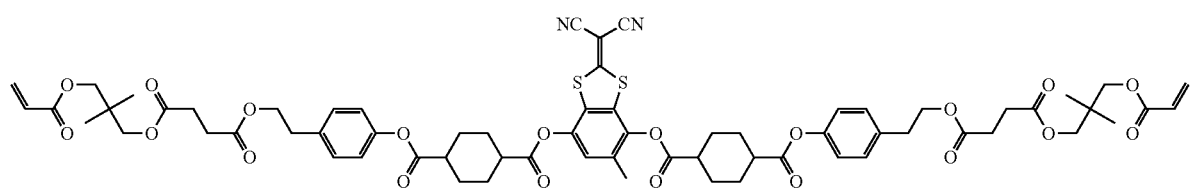

[Polymerization Initiator-1]

S-1

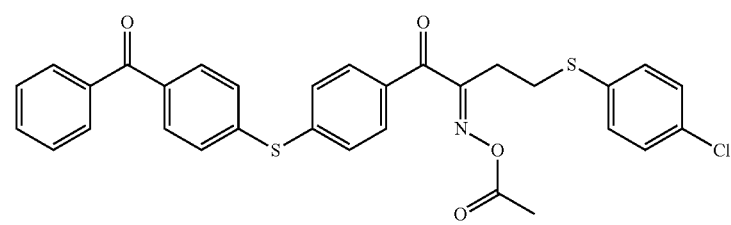

(Preparation of Circularly Polarizing Plate P)

A circularly polarizing plate P was prepared according to the same procedure as the preparation procedure of the circularly polarizing plate X except that instead of using the optically anisotropic layer A, the optically anisotropic layer E was used and the optically anisotropic layer B was not used. In a case where the clockwise direction was as a positive value with the transmission axis of the polarizer as a reference (0°) when observed from the polarizer side, the angle of the slow axis of the optically anisotropic layer E was −45°.

Example 42

An organic EL display device substitute was prepared according to the same procedure as in Example 2 except that instead of using the circularly polarizing plate X, the circularly polarizing plate P was used, and various evaluations were performed. The results are shown in Table 1.

Example 43

An organic EL display device substrate was prepared according to the same procedure as in Example 3 except that instead of using the circularly polarizing plate X, the circularly polarizing plate P was used, and various evaluations were performed. The results are shown in Table 1.

Example 44

An organic EL display device substrate was prepared according to the same procedure as in Example 4 except that instead of using the circularly polarizing plate X, the circularly polarizing plate P was used, and various evaluations were performed. The results are shown in Table 1.

Example 45

An organic EL display device substrate was prepared according to the same procedure as in Example 5 except that instead of using the circularly polarizing plate X, the circularly polarizing plate P was used, and various evaluations were performed. The results are shown in Table 1.

Example 46

An organic EL display device substrate was prepared according to the same procedure as in Example 5 except that instead of using the circularly polarizing plate X, a circularly polarizing plate Q was used, and various evaluations were performed. The results are shown in Table 1.

(Preparation of Circularly Polarizing Plate Q)

A circularly polarizing plate Q was prepared according to the same procedure as the preparation procedure of the circularly polarizing plate X except that instead of using the optically anisotropic layer A, the optically anisotropic layer E was used, instead of using the optically anisotropic layer B, the optically anisotropic layer G was used, and the angular relationship between the absorption axis of the linear polarizer and the slow axis of the optically anisotropic layer E was set as shown in Table 1.

Example 47

An organic EL display device substrate was prepared according to the same procedure as in Example 7 except that instead of using the circularly polarizing plate X, the circularly polarizing plate P was used, and various evaluations were performed. The results are shown in Table 1.

Example 48

An organic EL display device substrate was prepared according to the same procedure as in Example 8 except that instead of using the circularly polarizing plate X, the circularly polarizing plate P was used, and various evaluations were performed. The results are shown in Table 1.

Example 49

An organic EL display device substrate was prepared according to the same procedure as in Example 9 except that instead of using the circularly polarizing plate X, the circularly polarizing plate P was used, and various evaluations were performed. The results are shown in Table 1.

Example 50

An organic EL display device substrate was prepared according to the same procedure as in Example 10 except that instead of using the circularly polarizing plate X, the circularly polarizing plate P was used, and various evaluations were performed. The results are shown in Table 1.

Example 51

An organic EL display device substrate was prepared according to the same procedure as in Example 10 except that instead of using the circularly polarizing plate X, the circularly polarizing plate Q was used, and various evaluations were performed. The results are shown in Table 1.

Example 52

An organic EL display device substrate was prepared according to the same procedure as in Example 10 except that instead of using the circularly polarizing plate X, a circularly polarizing plate Q1 was used, and various evaluations were performed. The results are shown in Table 1.

(Formation of Photo Alignment Film)

A photo alignment coating liquid 1 prepared by referring to the description in Example 3 of JP2012-155308A was applied to the surface of one side of a long cellulose acylate film (ZRD 40, manufactured by Fujifilm Corporation) using a #2 bar. After application, the solvent was removed by drying to form a photoisomerization composition layer 1.

The obtained photoisomerization composition layer 1 was irradiated with polarized ultraviolet rays (180 mJ/cm$^2$, using an ultra-high pressure mercury lamp) to form a photo alignment film.

(Preparation of Optically Anisotropic Layer E1)

An optically anisotropic layer E1 was prepared according to the same procedure as the preparation procedure of the optically anisotropic layer E except that instead of using the alignment film, a photo alignment film was used.

(Preparation of Circularly Polarizing Plate Q1)

A circularly polarizing plate Q1 was prepared according to the same procedure as the preparation procedure of the polarizing plate Q except that instead of using the optically anisotropic layer E, the optically anisotropic layer E1 was used, and the cellulose acylate film and the photo alignment film were not peeled off.

Example 53

An organic EL display device substrate was prepared according to the same procedure as in Example 10 except that instead of using the circularly polarizing plate X, a circularly polarizing plate R prepared according to the following procedure was used, and various evaluations were performed. The results are shown in Table 1.

(Preparation of Optically Anisotropic Layer F)

The alignment film A prepared in Example 1 was continuously subjected to a rubbing treatment. At this time, the longitudinal direction of the long film was parallel to the transport direction, and the angle between the longitudinal direction of the film and the rotation axis of the rubbing roller was set to 45° (in a case where the width direction of the film was set to 0°, the longitudinal direction of the film was set to 900 and the clockwise direction was expressed as a positive value with the width direction of the film as a reference when observed from the alignment film A side, the angle of the rotational axis of the rubbing roller was −45°).

Thereafter, according to the same procedure as the embodiment using a composition for forming a liquid crystal cured film (A-1) described in the section of Example of JP2016-040603A, an optically anisotropic layer F (thickness: 2.0 μm) was prepared. The in-plane retardation of the optically anisotropic layer F at a wavelength of 550 nm is 143 nm, and the optically anisotropic layer F exhibits reverse wavelength dispersibility.

(Preparation of Circularly Polarizing Plate R)

Next, a circularly polarizing plate R was prepared according to the same procedure as the preparation procedure of the circularly polarizing plate P except that instead of using the optically anisotropic layer E, the optically anisotropic layer F was used.

Example 54

An organic EL display device substitute was prepared according to the same procedure as in Example 10 except that instead of using the circularly polarizing plate X, a circularly polarizing plate S prepared according to the following procedure was used, and various evaluations were performed. The results are shown in Table 1.

(Preparation of Circularly Polarizing Plate S)

A circularly polarizing plate S was prepared according to the same procedure as the preparation procedure of the circularly polarizing plate X except that instead of using the optically anisotropic layer A, the optically anisotropic layer F was used, instead of using the optically anisotropic layer B, the optically anisotropic layer G was used, and the angular relationship between the absorption axis of the linear polarizer and the slow axis of the optically anisotropic layer F was set as shown in Table 1.

Example 55

An organic EL display device substitute was prepared according to the same procedure as in Example 10 except that instead of using the circularly polarizing plate X, a circularly polarizing plate T prepared according to the following procedure was used, and various evaluations were performed. The results are shown in Table 1.

(Preparation of Optically Anisotropic Layer H)

An optically anisotropic layer H (thickness: 46 μm) was prepared according to the same procedure as in Example 3 described in the section of Example of JP2015-212368A. The in-plane retardation of the optically anisotropic layer H at a wavelength of 550 nm is 145 nm and the optically anisotropic layer H exhibits reverse wavelength dispersibility.

(Preparation of Circularly Polarizing Plate T)

Next, a circularly polarizing plate T was prepared according to the same procedure as the preparation procedure of the circularly polarizing plate X except that instead of using the optically anisotropic layer A, the optically anisotropic layer H was used, instead of using the optically anisotropic layer B, the optically anisotropic layer G was used, and the angular relationship between the absorption axis of the linear polarizer and the slow axis of the optically anisotropic layer H was set as shown in Table 1.

Example 56

An organic EL display device substitute was prepared according to the same procedure as in Example 10 except that instead of using the circularly polarizing plate X, a circularly polarizing plate K prepared according to the following procedure was used, and various evaluations were performed. The results are shown in Table 1.

(Preparation of Optically Anisotropic Layer K)

An optically anisotropic layer K (thickness: 44 μm) was prepared according to the same procedure as in Example 5 described in the section of Example of JP2015-212368A. The in-plane retardation of the optically anisotropic layer K at a wavelength of 550 nm is 138 nm and the optically anisotropic layer K exhibits reverse wavelength dispersibility.

(Preparation of Circularly Polarizing Plate K)

Next, a circularly polarizing plate K was prepared according to the same procedure as the preparation procedure of the circularly polarizing plate X except that instead of using the optically anisotropic layer A, the optically anisotropic layer K was used, instead of using the optically anisotropic layer B, the optically anisotropic layer G was used, and the angular relationship between the absorption axis of the linear polarizer and the slow axis of the optically anisotropic layer K was set as shown in Table 1.

Example 57

An organic EL display device substitute was prepared according to the same procedure as in Example 10 except that instead of using the circularly polarizing plate X, a circularly polarizing plate O prepared according to the following procedure was used, and various evaluations were performed. The results are shown in Table 1.

(Preparation of Optically Anisotropic Layer M)

An optically anisotropic layer M (thickness: 54 μm) was prepared according to the same procedure as in Comparative Example 13 described in the section of Example of JP2015-212368. The in-plane retardation of the optically anisotropic layer M at a wavelength of 550 nm is 145 nm and the optically anisotropic layer M exhibits reverse wavelength dispersibility.

(Preparation of Circularly Polarizing Plate O)

Next, a circularly polarizing plate O was prepared according to the same procedure as the preparation procedure of the circularly polarizing plate X except that instead of using the optically anisotropic layer A, the optically anisotropic layer M was used, instead of using the optically anisotropic layer B, the optically anisotropic layer G was used, and the angular relationship between the absorption axis of the linear polarizer and the slow axis of the optically anisotropic layer M was set as shown in Table 1.

Example 58

An organic EL display device substitute was prepared according to the same procedure as in Example 10 except that instead of using the circularly polarizing plate X, a circularly polarizing plate U prepared according to the following procedure was used, and various evaluations were performed. The results are shown in Table 1.

(Preparation of Optically Anisotropic Layer I (Corresponding to λ/2 Plate))

An optically anisotropic layer I (thickness: 28 μm) was prepared according to the same procedure as in Example 5 described in the section of Example of JP2016-212171A. The in-plane retardation of the optically anisotropic layer I at a wavelength of 550 nm is 260 nm and the optically anisotropic layer I exhibits forward wavelength dispersibility.

(Preparation of Optically Anisotropic Layer J (Corresponding to λ/4 Plate))

An optically anisotropic layer J (thickness: 22 μm) was prepared according to the same procedure as in Example 5 described in the section of Example of JP2016-212171. The in-plane retardation of the optically anisotropic layer J at a wavelength of 550 nm is 130 nm and the optically anisotropic layer J exhibits forward wavelength dispersibility.

(Preparation of Circularly Polarizing Plate U)

Next, a circularly polarizing plate U was prepared according to the same procedure as the preparation procedure of the circularly polarizing plate W except that instead of using the optically anisotropic layer A, the optically anisotropic layer I was used and instead of using the optically anisotropic layer B, the optically anisotropic layer J was used.

Example 59

An organic EL display device substrate was prepared according to the same procedure as in Example 10 except that instead of using the circularly polarizing plate X, a circularly polarizing plate L prepared according to the following procedure was used, and various evaluations were performed. The results are shown in Table 1.

(Preparation of Circularly Polarizing Plate L)

A circularly polarizing plate L was prepared according to the same procedure as the preparation procedure of the circularly polarizing plate W except that instead of using the optically anisotropic layer B, the optically anisotropic layer J was used.

Example 60

An organic EL display device substrate was prepared according to the same procedure as in Example 10 except that instead of using the circularly polarizing plate X, a circularly polarizing plate M prepared according to the following procedure was used, and various evaluations were performed. The results are shown in Table 1.

(Preparation of Circularly Polarizing Plate M)

A circularly polarizing plate M was prepared according to the same procedure as the preparation procedure of the circularly polarizing plate W except that instead of using the optically anisotropic layer A, the optically anisotropic layer I was used.

Example 61

An organic EL display device substrate was prepared according to the same procedure as in Example 10 except that instead of using the circularly polarizing plate X, a circularly polarizing plate X5 prepared according to the following procedure was used, and various evaluations were performed. The results are shown in Table 1.

(Formation of Alignment Film B1)

One surface of the alignment film B prepared in Example 13 was irradiated with ultraviolet rays (UV) of 8.5 mJ/cm$^2$ from the alignment film side using a LED lamp (manufactured by Nikkiso Co., Ltd., λ=285 nm) at 105° C. to obtain an alignment film B1 (thickness: 0.5 μm).

(Preparation of Optically Anisotropic Layer A14 (Corresponding to λ/2 Plate))

An optically anisotropic layer A14 was prepared according to the same procedure as in Example 14 except that instead of using the alignment film B, the alignment film B1 was used.

(Preparation of Circularly Polarizing Plate X5)

A circularly polarizing plate X5 was prepared according to the same procedure as the preparation procedure of the circularly polarizing plate X except that instead of using the optically anisotropic layer A, the optically anisotropic layer A14 was used, instead of using the optically anisotropic layer B, the optically anisotropic layer B2 was used, and the cellulose acylate film, the alignment film B1, and the alignment film B were not respectively peeled off. That is, in the circularly polarizing plate X5, the polarizer, the adhesion layer, the optically anisotropic layer A14 (λ/2 plate), the alignment film B1, the cellulose acylate film, the adhesion layer, the optically anisotropic layer B2 (λ/4 plate), the alignment film B, and the cellulose acylate film were arranged in this order.

Comparative Example 1

An organic EL display device substrate was prepared according to the same procedure as in Example 1 except that the direction of the absorption axis of the linear polarizer with respect to the ridge line direction of the organic EL display device substrate was changed from 25° to 45°, and various evaluations were performed. The results are shown in Table 1.

Comparative Example 2

An organic EL display device substrate was prepared according to the same procedure as in Example 1 except that the direction of the absorption axis of the linear polarizer with respect to the ridge line direction of the organic EL display device substrate was changed from 25° to 135°, and various evaluations were performed. The results are shown in Table 1.

Comparative Example 3

An organic EL display device substrate was prepared according to the same procedure as in Example 1 except that the complex modulus of elasticity of the pressure sensitive adhesive between the circularly polarizing plate and the organic EL display panel substrate was changed from 1.37×10$^5$ Pa to 4.47×10$^5$ Pa, and various evaluations were performed. The results are shown in Table 1.

Comparative Example 4

An organic EL display device substrate was prepared according to the same procedure as in Example 41 except that the direction of the absorption axis of the linear polarizer with respect to the ridge line direction of the organic EL display device substrate was changed from 25° to 45°, and various evaluations were performed. The results are shown in Table 1.

Comparative Example 5

An organic EL display device substrate was prepared according to the same procedure as in Example 46 except that the direction of the absorption axis of the linear polarizer with respect to the ridge line direction of the organic EL display device substrate was changed from 00 to 450, and various evaluations were performed. The results are shown in Table 1.

Comparative Example 6

An organic EL display device substrate was prepared according to the same procedure as in Example 41 except that the complex modulus of elasticity of the pressure sensitive adhesive between the circularly polarizing plate and the organic EL display panel substrate was changed from $1.37×10^5$ Pa to $4.47×10^5$ Pa, and various evaluations were performed. The results are shown in Table 1.

Comparative Example 7

An organic EL display device substitute was prepared according to the same procedure as in Example 1 except that instead of using the circularly polarizing plate X, a circularly polarizing plate N prepared according to the following procedure was used, and the thickness of the pressure sensitive adhesive layer between the circularly polarizing plate N and the organic EL display panel substitute was set to 50 μm, and various evaluations were performed. The results are shown in Table 1.

(Preparation of Circularly Polarizing Plate N)

A circularly polarizing plate N was prepared according to the same procedure as the preparation procedure of the circularly polarizing plate X except that instead of using the UV curable type adhesive, the polarizer and the optically anisotropic layer A were laminated using a pressure sensitive adhesive layer having a thickness of 50 μm.

In Table 1, in the "condition" column, a case where the first adhesion layer is thicker than the second adhesion layer is "A" and a case where the thickness of the first adhesion layer is equal to or less than the thickness of the second adhesion layer is "B".

In Table 1, "Liquid crystal A" to "Liquid crystal G" respectively mean the optically anisotropic layers A to G. "Stretched H" to "Stretched K" respectively mean the optically anisotropic layers H to K.

In Table 1, "Polarizer absorption axis angle (°)" means the angular position of the absorption axis of the linear polarizer with respect to the extension direction of the ridge line formed in a case where the organic EL display device substitute is bent.

In Table 1, "Angle of phase difference layer (1) (°)" and "Angle of phase difference layer (2) (°)" represent the angular position of the phase difference layer when the counterclockwise direction with the transmission axis of the linear polarizer as a reference (0°) is expressed as a positive value.

TABLE 1

| 1-1 | No. | Phase difference layer (1) | Phase difference layer (2) | Positive C-plate | Thickness of pressure sensitive adhesive layer (first adhesion layer) (μm) | Thickness of circularly polarizing plate (μm) | Thickness of phase difference layer (μm) | Thickness of second adhesion layer (μm) | Polarizer absorption axis angle (°) | Angle of phase difference layer (1) (°) | Angle of phase difference layer (2) (°) | Curvature diameter (mm) | Complex modulus of elasticity of pressure sensitive adhesive layer (× 10⁵ Pa) | Condition | Front tint (after bending) | Crackability/ peelability | Durability | Oblique tint |
|---|---|---|---|---|---|---|---|---|---|---|---|---|---|---|---|---|---|---|
| Example | 1 | Liquid crystal A | Liquid crystal B | | 100 | 40 | 5 | 2 | 25 | 17.5 | 77.5 | 3 | 1.37 | A | 7 | A | B | C |
| Example | 2 | Liquid crystal A | Liquid crystal B | | 100 | 40 | 5 | 2 | 115 | 17.5 | 77.5 | 3 | 1.37 | A | 7 | A | B | C |
| Example | 3 | Liquid crystal A | Liquid crystal B | | 100 | 40 | 5 | 2 | 15 | 17.5 | 77.5 | 3 | 1.37 | A | 8 | A | B | C |
| Example | 4 | Liquid crystal A | Liquid crystal B | | 100 | 40 | 5 | 2 | 105 | 17.5 | 77.5 | 3 | 1.37 | A | 8 | A | B | C |
| Example | 5 | Liquid crystal A | Liquid crystal B | | 100 | 40 | 5 | 2 | 0 | 17.5 | 77.5 | 3 | 1.37 | A | 9 | A | B | C |
| Example | 6 | Liquid crystal A | Liquid crystal B | | 100 | 40 | 5 | 2 | 90 | 17.5 | 77.5 | 3 | 1.37 | A | 9 | A | B | C |
| Example | 7 | Liquid crystal A | Liquid crystal B | | 100 | 40 | 5 | 2 | 25 | 17.5 | 77.5 | 3 | 1.91 | A | 6 | B | B | C |
| Example | 8 | Liquid crystal A | Liquid crystal B | | 100 | 40 | 5 | 2 | 0 | 17.5 | 77.5 | 3 | 1.91 | A | 7 | B | B | C |
| Example | 9 | Liquid crystal A | Liquid crystal B | | 100 | 40 | 5 | 2 | 25 | 17.5 | 77.5 | 3 | 1.91 | A | 8 | A | B | C |
| Example | 10 | Liquid crystal A | Liquid crystal B | | 100 | 40 | 5 | 2 | 0 | 17.5 | 77.5 | 3 | 0.59 | A | 10 | A | B | C |
| Example | 11 | Liquid crystal A | Liquid crystal B | | 100 | 40 | 5 | 2 | 90 | 17.5 | 77.5 | 3 | 0.59 | A | 10 | A | B | C |
| Example | 12 | Liquid crystal A1 | Liquid crystal B | | 100 | 190 | 165 | 2 | 0 | 17.5 | 77.5 | 3 | 0.59 | A | 5 | B | B | C |
| Example | 13 | Liquid crystal A2 | Liquid crystal B2 | | 100 | 190 | 165 | 2 | 0 | 17.5 | 77.5 | 3 | 0.59 | A | 5 | B | B | C |
| Example | 14 | Liquid crystal A3 | Liquid crystal B2 | | 100 | 190 | 165 | 2 | 0 | 17.5 | 77.5 | 3 | 0.59 | A | 5 | B | B | C |
| Example | 15 | Liquid crystal A4 | Liquid crystal B | | 100 | 40 | 5 | 2 | 0 | 17.5 | 77.5 | 3 | 0.59 | A | 10 | A | B | C |
| Example | 16 | Liquid crystal A | Liquid crystal B | | 100 | 65 (Both surfaces TAC) | 5 | 2 | 0 | 17.5 | 77.5 | 3 | 0.59 | A | 8 | A | B | C |
| Example | 17 | Liquid crystal A | Liquid crystal B | | 100 | 40 | 5 | 2 | 0 | 17.5 | 77.5 | 3 (Bending) | 0.59 | A | 10 | A | B | C |
| Example | 18 | Liquid crystal A | Liquid crystal B | | 100 | 40 | 5 | 2 | 25 | 17.5 | 77.5 | 1 | 1.37 | A | 6 | A | B | C |
| Example | 19 | Liquid crystal A | Liquid crystal B | | 100 | 40 | 5 | 2 | 25 | 17.5 | 77.5 | 10 | 1.37 | A | 9 | A | B | C |
| Example | 20 | Liquid crystal A | Liquid crystal B | | 100 | 51 | 5 | 2 | 0 | 17.5 | 77.5 | 3 | 0.59 | A | 9 | A | B | C |
| Example | 21 | Liquid crystal A | Liquid crystal B | | 100 | 51 | 16 | 13 | 0 | 17.5 | 77.5 | 3 | 0.59 | A | 9 | B | B | C |
| Example | 22 | Liquid crystal A | Liquid crystal B | | 25 | 40 | 5 | 2 | 25 | 17.5 | 77.5 | 3 | 1.37 | A | 8 | A | B | C |
| Example | 23 | Liquid crystal A | Liquid crystal B | | 50 | 40 | 5 | 2 | 25 | 17.5 | 77.5 | 3 | 1.37 | A | 6 | A | B | C |
| Example | 24 | Liquid crystal A | Liquid crystal C | | 150 | 40 | 5 | 2 | 25 | 17.5 | 77.5 | 3 | 1.37 | A | 6 | A | B | C |
| Example | 25 | Liquid crystal D | Liquid crystal B | | 100 | 40 | 5 | 2 | 0 | 17.5 | 77.5 | 3 | 0.59 | A | 10 | A | A | B |
| Example | 26 | Liquid crystal D | Liquid crystal C | | 100 | 40 | 5 | 2 | 0 | 17.5 | 77.5 | 3 | 0.59 | A | 10 | A | A | B |
| Example | 27 | Liquid crystal A | Liquid crystal B | | 100 | 40 | 5 | 2 | 0 | 17.5 | 77.5 | 3 | 0.59 | A | 10 | A | A | C |
| Example | 28 | Liquid crystal A | Liquid crystal B | | 100 | 43 | 8 | 2 | 0 | 17.5 | 77.5 | 3 | 0.59 | A | 10 | A | B | C |
| Example | 29 | Liquid crystal A5 | Liquid crystal C1 | Liquid crystal G | 100 | 40 | 5 | 2 | 0 | 17.5 | 77.5 | 3 | 0.59 | A | 10 | A | A | B |

TABLE 2

| 1-2 | No. | Phase difference layer (1) | Phase difference layer (2) | Positive C-plate | Thickness of pressure sensitive adhesive layer (first adhesion layer) (μm) | Thickness of circularly polarizing plate (μm) | Thickness of phase difference layer (μm) | Thickness of second adhesion layer (μm) | Polarizer absorption axis angle (°) | Angle of phase difference layer (1) (°) | Angle of phase difference layer (2) (°) | Curvature diameter (mm) | Complex modulus of elasticity of pressure sensitive adhesive layer (×10⁵ Pa) | Condition | Front tint (after bending) | Crackability/peelability | Durability | Oblique tint |
|---|---|---|---|---|---|---|---|---|---|---|---|---|---|---|---|---|---|---|
| Example | 30 | Liquid crystal A6 | Liquid crystal C2 | | 100 | 40 | 5 | 2 | 0 | 17.5 | 77.5 | 3 | 0.59 | A | 10 | A | A | B |
| Example | 31 | Liquid crystal A7 | Liquid crystal C3 | | 100 | 40 | 5 | 2 | 0 | 17.5 | 77.5 | 3 | 0.59 | A | 10 | A | A | B |
| Example | 32 | Liquid crystal A8 | Liquid crystal C | | 100 | 40 | 5 | 2 | 0 | 17.5 | 77.5 | 3 | 0.59 | A | 10 | A | A | B |
| Example | 33 | Liquid crystal A9 | Liquid crystal C | | 100 | 40 | 5 | 2 | 0 | 17.5 | 77.5 | 3 | 0.59 | A | 10 | A | A | B |
| Example | 34 | Liquid crystal A10 | Liquid crystal C1 | | 100 | 40 | 5 | 2 | 0 | 17.5 | 77.5 | 3 | 0.59 | A | 10 | A | A | B |
| Example | 35 | Liquid crystal A11 | Liquid crystal C | | 100 | 40 | 5 | 2 | 0 | 17.5 | 77.5 | 3 | 0.59 | A | 10 | A | A | B |
| Example | 36 | Liquid crystal A12 | Liquid crystal C | | 100 | 40 | 5 | 2 | 0 | 17.5 | 77.5 | 3 | 0.59 | A | 10 | A | A | B |
| Example | 37 | Liquid crystal A13 | Liquid crystal C | | 100 | 40 | 5 | 2 | 0 | 17.5 | 77.5 | 3 | 0.59 | A | 10 | A | A | B |
| Example | 38 | Liquid crystal A | Liquid crystal C4 | | 100 | 40 | 5 | 2 | 0 | 17.5 | 77.5 | 3 | 0.59 | A | 10 | A | A | B |
| Example | 39 | Liquid crystal A | Liquid crystal C5 | | 100 | 40 | 5 | 2 | 0 | 17.5 | 77.5 | 3 | 0.59 | A | 10 | A | A | B |
| Example | 40 | Liquid crystal A | Liquid crystal C6 | | 100 | 40 | 5 | 2 | 0 | 17.5 | 77.5 | 3 | 0.59 | A | 10 | A | A | B |
| Example | 41 | Liquid crystal E | | | 100 | 37 | 2 | 2 | 25 | 45 | — | 3 | 1.37 | A | 7 | A | C | B |
| Example | 42 | Liquid crystal E | | | 100 | 37 | 2 | 2 | 115 | 45 | — | 3 | 1.37 | A | 7 | A | C | B |
| Example | 43 | Liquid crystal E | | | 100 | 37 | 2 | 2 | 15 | 45 | — | 3 | 1.37 | A | 8 | A | C | B |
| Example | 44 | Liquid crystal E | | | 100 | 37 | 2 | 2 | 105 | 45 | — | 3 | 1.37 | A | 8 | A | C | B |
| Example | 45 | Liquid crystal E | | | 100 | 37 | 2 | 2 | 0 | 45 | — | 3 | 1.37 | A | 9 | A | C | B |
| Example | 46 | Liquid crystal E | | Liquid crystal G | 100 | 40 | 5 | 2 | 0 | 45 | — | 3 | 1.37 | A | 9 | A | C | A |
| Example | 47 | Liquid crystal E | | | 100 | 37 | 2 | 2 | 25 | 45 | — | 3 | 1.91 | A | 6 | B | C | B |
| Example | 48 | Liquid crystal E | | | 100 | 37 | 2 | 2 | 0 | 45 | — | 3 | 1.91 | A | 7 | B | C | B |
| Example | 49 | Liquid crystal E | | | 100 | 37 | 2 | 2 | 25 | 45 | — | 3 | 0.59 | A | 8 | A | C | B |
| Example | 50 | Liquid crystal E | | | 100 | 37 | 2 | 2 | 0 | 45 | — | 3 | 0.59 | A | 10 | A | C | B |
| Example | 51 | Liquid crystal E | | Liquid crystal G | 100 | 40 | 5 | 2 | 0 | 45 | — | 3 | 0.59 | A | 10 | A | C | A |

TABLE 2-continued

| 1-2 | No. | Phase difference layer (1) | Phase difference layer (2) | Positive C-plate | Thickness of pressure sensitive adhesive layer (first adhesion layer) (μm) | Thickness of circularly polarizing plate (μm) | Thickness of phase difference layer (μm) | Thickness of second adhesion layer (μm) | Polarizer absorption axis angle (°) | Angle of phase difference layer (1) (°) | Angle of phase difference layer (2) (°) | Curvature diameter (mm) | Complex modulus of elasticity of pressure sensitive adhesive layer (×10⁵ Pa) | Condition | Front tint (after bending) | Crackability/peelability | Durability | Oblique tint |
|---|---|---|---|---|---|---|---|---|---|---|---|---|---|---|---|---|---|---|
| Example | 52 | Liquid crystal E1 | | Liquid crystal G | 100 | 80 | 45 | 2 | 0 | 45 | — | 3 | 0.59 | A | 7 | A | C | A |
| Example | 53 | Liquid crystal F | | Liquid crystal G | 100 | 37 | 2 | 2 | 0 | 45 | — | 3 | 0.59 | A | 10 | A | C | B |
| Example | 54 | Liquid crystal F | | Liquid crystal G | 100 | 40 | 5 | 2 | 0 | 45 | — | 3 | 0.59 | A | 10 | A | C | A |
| Example | 55 | Stretched H | | Liquid crystal G | 100 | 84 | 49 | 2 | 0 | 45 | — | 3 | 0.59 | A | 7 | B | A | A |
| Example | 56 | Stretched K | | Liquid crystal G | 100 | 82 | 47 | 2 | 0 | 45 | — | 3 | 0.59 | A | 7 | B | A | A |
| Example | 57 | Stretched M | | Liquid crystal G | 100 | 92 | 57 | 2 | 0 | 45 | — | 3 | 0.59 | A | 7 | B | B | B |
| Example | 58 | Stretched I | Stretched J | Liquid crystal G | 100 | 90 | 55 | 2 | 0 | 15 | 75 | 3 | 0.59 | A | 7 | B | A | B |
| Example | 59 | Liquid crystal A | Stretched J | Liquid crystal G | 100 | 64 | 29 | 2 | 0 | 17.5 | 75 | 3 | 0.59 | A | 8 | A | A | B |
| Example | 60 | Stretched I | Liquid crystal B | Liquid crystal G | 100 | 69 | 34 | 2 | 0 | 15 | 77.5 | 3 | 0.59 | A | 8 | A | A | B |
| Example | 61 | Liquid crystal E14 | Liquid crystal B2 | Liquid crystal G | 100 | 190 | 165 | 2 | 0 | 17.5 | 77.5 | 3 | 0.59 | A | 5 | B | B | C |

| 1-3 | No. | Phase difference layer (1) | Phase difference layer (2) | Positive C-plate | Thickness of pressure sensitive adhesive layer (first adhesion layer) (μm) | Thickness of circularly polarizing plate (μm) | Thickness of phase difference layer (μm) | Thickness of second adhesion layer (μm) | Polarizer absorption axis angle (°) | Angle of phase difference layer (1) (°) | Angle of phase difference layer (2) (°) | Curvature diameter (mm) | Complex modulus of elasticity of pressure sensitive adhesive layer (× 10⁵ Pa) | Condition | Front tint (after bending) | Evaluation Crackability/ peelability | Durability | Oblique tint |
|---|---|---|---|---|---|---|---|---|---|---|---|---|---|---|---|---|---|---|
| Comparative Example | 1 | Liquid crystal A | Liquid crystal B | | 100 | 40 | 5 | 2 | 45 | 17.5 | 77.5 | 3 | 1.37 | A | 4 | A | B | C |
| Comparative Example | 2 | Liquid crystal A | Liquid crystal B | | 100 | 40 | 5 | 2 | 135 | 17.5 | 77.5 | 3 | 1.37 | A | 4 | A | B | C |
| Comparative Example | 3 | Liquid crystal A | Liquid crystal B | | 100 | 40 | 5 | 2 | 25 | 17.5 | 77.5 | 3 | 4.47 | A | 0 | C | B | C |
| Comparative Example | 4 | Liquid crystal E | | | 100 | 37 | 2 | 2 | 45 | 45 | — | 3 | 1.37 | A | 4 | A | C | B |
| Comparative Example | 5 | Liquid crystal E | | Liquid crystal G | 100 | 40 | 5 | 2 | 45 | 45 | — | 3 | 1.37 | A | 4 | A | C | A |
| Comparative Example | 6 | Liquid crystal E | | | 100 | 37 | 2 | 2 | 25 | 45 | — | 3 | 4.47 | A | 0 | C | C | B |
| Comparative Example | 7 | Liquid crystal A | Liquid crystal B | | 50 | 88 | 5 | 50 | 25 | 17.5 | 77.5 | 3 | 1.37 | B | 3 | B | B | C |

From the results shown in Table 1 above, it can be seen that the organic EL display device of the present invention can achieve desired effects.

Among them, from the comparison of Examples 1 to 6, it was confirmed that in a case where the polarizer absorption axis angle was 0°±200 or 90°±20° (preferably 0°±10° or 90°±10°), further excellent effects were obtained.

From the comparison of Examples 7 to 11, it was confirmed that in a case where the complex modulus of elasticity of the pressure sensitive adhesive layer was $1.50 \times 10^5$ Pa or less (preferably $1.00 \times 10^5$ Pa or less), further excellent effects were obtained.

From the comparison of Examples 22 to 24, it was confirmed that in a case where the thickness of the first adhesion layer was 100 μm or less (preferably 50 μm or less and more preferably 30 μm or less), further excellent effects were obtained.

From the comparison of Examples 25 to 27, it was confirmed that in a case where one of the λ/4 plate and the λ/2 plate was a layer formed of a rod-like liquid crystal compound and the other was a layer formed of a disk-like liquid crystal compound, further excellent effects were obtained.

From Examples above, it was confirmed that in a case where the thickness of the circularly polarizing plate was 60 μm or less and the thickness of the phase difference layer was 20 μm or less, further excellent effects were obtained.

EXPLANATION OF REFERENCES 10, 100: organic EL display device
12: circularly polarizing plate
14: first adhesion layer
16: organic EL display panel
18: linear polarizer
20: second adhesion layer
22: phase difference layer functioning as λ/4 plate
30: flat portion
24: bent portion

What is claimed is:

1. An organic electroluminescent display device comprising, from a viewing side:
    a circularly polarizing plate;
    a first adhesion layer; and
    a bendable organic electroluminescent display panel,
    wherein the circularly polarizing plate includes, from the viewing side, a linear polarizer, a second adhesion layer, and a phase difference layer functioning as a λ/4 plate,
    a complex modulus of elasticity of the first adhesion layer is $2.50 \times 10^5$ Pa or less,
    the first adhesion layer is thicker than the second adhesion layer, and
    an absorption axis of the linear polarizer is positioned at an angle of 0°±30° or 90°±30° with respect to an extension direction of a ridge line formed in a case where the organic electroluminescent display device is bent, and
    wherein the phase difference layer further includes a positive C-plate in which a retardation in a thickness direction is −150 to −10 nm at a wavelength of 550 nm.

2. The organic electroluminescent display device according to claim 1,
    wherein the phase difference layer exhibits reverse wavelength dispersibility.

3. The organic electroluminescent display device according to claim 1,
    wherein the phase difference layer includes a λ/2 plate exhibiting forward wavelength dispersibility and a λ/4 plate exhibiting forward wavelength dispersibility.

4. The organic electroluminescent display device according to claim 3,
    wherein at least one of the λ/2 plate or the λ/4 plate is a layer formed by using a liquid crystal compound.

5. The organic electroluminescent display device according to claim 1,
    wherein the phase difference layer includes a single layer of λ/4 plate exhibiting reverse wavelength dispersibility.

6. The organic electroluminescent display device according to claim 5,
    wherein the λ/4 plate is a layer formed by using a liquid crystal compound.

7. The organic electroluminescent display device according to claim 1,
    wherein the phase difference layer has a thickness of 20 μm or less.

8. The organic electroluminescent display device according to claim 2,
    wherein the phase difference layer includes a λ/2 plate exhibiting forward wavelength dispersibility and a λ/4 plate exhibiting forward wavelength dispersibility.

9. The organic electroluminescent display device according to claim 2,
    wherein the phase difference layer includes a single layer of λ/4 plate exhibiting reverse wavelength dispersibility.

10. The organic electroluminescent display device according to claim 2,
    wherein the phase difference layer has a thickness of 20 μm or less.

11. The organic electroluminescent display device according to claim 3,
    wherein the phase difference layer has a thickness of 20 μm or less.

12. The organic electroluminescent display device according to claim 4,
    wherein the phase difference layer has a thickness of 20 μm or less.

13. The organic electroluminescent display device according to claim 5,
    wherein the phase difference layer has a thickness of 20 μm or less.

14. The organic electroluminescent display device according to claim 6,
    wherein the phase difference layer has a thickness of 20 μm or less.

* * * * *